US011405008B2

(12) United States Patent
Nagasato et al.

(10) Patent No.: US 11,405,008 B2
(45) Date of Patent: Aug. 2, 2022

(54) SWITCHING POWER SUPPLY, SEMICONDUCTOR INTEGRATED CIRCUIT DEVICE, AND DIFFERENTIAL INPUT CIRCUIT

(71) Applicant: Rohm Co., Ltd., Kyoto (JP)

(72) Inventors: Masashi Nagasato, Kyoto (JP); Seiji Takenaka, Kyoto (JP); Tetsuo Tateishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 30 days.

(21) Appl. No.: 17/056,314

(22) PCT Filed: Dec. 18, 2018

(86) PCT No.: PCT/JP2018/046497
§ 371 (c)(1),
(2) Date: Nov. 17, 2020

(87) PCT Pub. No.: WO2019/244374
PCT Pub. Date: Dec. 26, 2019

(65) Prior Publication Data
US 2021/0257978 A1    Aug. 19, 2021

(30) Foreign Application Priority Data

Jun. 22, 2018 (JP) ............................. JP2018-118506
Jun. 26, 2018 (JP) ............................. JP2018-120560
Jun. 26, 2018 (JP) ............................. JP2018-120564

(51) Int. Cl.
*H03F 3/217*     (2006.01)
*H03F 3/45*      (2006.01)
(Continued)

(52) U.S. Cl.
CPC ........ *H03F 3/45475* (2013.01); *H02M 3/158* (2013.01); *H03F 1/523* (2013.01);
(Continued)

(58) Field of Classification Search
CPC ................................. H03F 3/217; H03F 3/38
(Continued)

(56) References Cited

U.S. PATENT DOCUMENTS 6,583,664 B2 *  6/2003 Mathe .................. H03F 3/2173
                                                     330/136
9,276,530 B1 *  3/2016 Liu ....................... H03F 3/2173
(Continued)

FOREIGN PATENT DOCUMENTS

JP       2005-287131       10/2005
JP       2008-043086       2/2008
(Continued)

OTHER PUBLICATIONS

Japan Patent Office, International Search Report for PCT/JP2018/046497 dated Mar. 19, 2019 with English translation.

*Primary Examiner* — Henry Choe
(74) *Attorney, Agent, or Firm* — Fish & Richardson P.C.

(57) ABSTRACT

This switching power source 100 has: a switching output circuit 110 which drives an inductor current IL by turning on and off an upper switch 111 and a lower switch 112 and generates an output voltage VOUT from an input voltage PVDD; a lower current detection unit 210 which detects the inductor current IL flowing through the lower switch 112 during an ON-period of the lower switch 112 and acquires lower current feedback information Iinfo; an error amplifier 140 which outputs voltage feedback information Vinfo including information on an error between the output voltage VOUT (feedback voltage FB) and a reference voltage REF; an information synthesis unit 220 that generates synthesis feedback information VIinfo by synthesizing Iinfo with Vinfo; and an information holding unit 230 which samples Vinfo during the ON-period of the lower switch 112.

12 Claims, 28 Drawing Sheets

(51) Int. Cl.
*H02M 3/158* (2006.01)
*H03F 1/52* (2006.01)

(52) U.S. Cl.
CPC ..... *H03F 3/2171* (2013.01); *H03F 2200/351* (2013.01); *H03F 2203/45726* (2013.01)

(58) Field of Classification Search
USPC .................................. 330/251.207 A, 10
See application file for complete search history.

(56) References Cited

U.S. PATENT DOCUMENTS

| | | |
|---|---|---|
| 10,326,365 B2 * | 6/2019 | Leoncini ............. H03K 17/163 |
| 2016/0082846 A1 | 3/2016 | Yamaguchi |
| 2016/0126842 A1 | 5/2016 | Oki et al. |
| 2017/0033776 A1 | 2/2017 | Tsutsumi |
| 2017/0155315 A1 | 6/2017 | Yasusaka et al. |
| 2019/0009678 A1 | 1/2019 | Yamaguchi |

FOREIGN PATENT DOCUMENTS

| | | |
|---|---|---|
| JP | 2011-072102 | 4/2011 |
| JP | 2016-067109 | 4/2016 |
| JP | 2016-092957 | 5/2016 |
| JP | 2017-034839 | 2/2017 |
| JP | 2017-107551 | 6/2017 |

* cited by examiner

SWITCHING POWER SUPPLY, SEMICONDUCTOR INTEGRATED CIRCUIT DEVICE, AND DIFFERENTIAL INPUT CIRCUIT

TECHNICAL FIELD

The invention described herein relates to switching power supplies, and relates also to semiconductor integrated circuit devices used as a principle controlling agent in switching power supplies, as well as to differential input circuits.

BACKGROUND ART

Switching power supplies (what is called DC-DC converters) are commonly used as a power supplying means in a variety of applications to generate from an input voltage a desired output voltage.

Some examples related to what has just been mentioned are seen in Patent Documents 1 and 2 identified below.

On the other hand, differential input circuits are widely used as an input stage in error amplifiers and comparators.

One example related to what has just been mentioned is seen in Patent Document 3 identified below.

CITATION LIST

Patent Literature

Patent Document 1: Japanese Unexamined Patent Application Publication No. 2016-067109
Patent Document 2: Japanese Unexamined Patent Application Publication No. 2017-107551
Patent Document 3: Japanese Unexamined Patent Application Publication No. 2011-72102

SUMMARY OF INVENTION

Technical Problem

In known switching power supplies of a current mode control type, acquiring information on a current passing through an inductor based on the on-resistance or the like of a switching element provides current feedback information only while the switching element is on. This requires the current feedback information to be retained with a sample and hold circuit during the period in which the switching element is off. Inconveniently, the sample and hold circuit produces a delay relative to voltage feedback information, and the temporal discrepancy between voltage feedback information and current feedback information spoils the performance of the switching power supply.

With known switching power supplies, if a feedback terminal for receiving feedback input of an output voltage becomes open, the output voltage rises abnormally, in the worst case destroying the load.

On the other hand, known differential input circuits leave room for further improvement for wider input dynamic ranges or for kickback prevention.

In view of the problems encountered by the present inventors, an object of the invention disclosed herein is to provide a switching power supply that offers improved performance by eliminating a temporal discrepancy between voltage feedback information and current feedback information through sampling-and-holding after the adding-up of voltage feedback information and current feedback information.

In view of the problems encountered by the present inventors, another object of the invention disclosed herein is to provide a switching power supply that can safely lower the output voltage when a feedback terminal becomes open.

In view of the problems encountered by the present inventors, yet another object of the invention disclosed herein is to provide a differential input circuit that achieves a wider input dynamic range or kickback prevention.

Solution to Problem

According to one aspect of what is disclosed herein, a switching power supply includes a switching output circuit which, by turning on and off high-side and low-side switches, drives an inductor current to generate an output voltage from an input voltage, a low-side current sensor which senses the inductor current passing through the low-side switch during the on-period of the low-side switch to acquire low-side current feedback information, an error amplifier which outputs voltage feedback information including error information obtained by comparing the output voltage or a feedback voltage commensurate with the output voltage with a reference voltage as its target, an information synthesizer which combines the voltage feedback information with the low-side current feedback information to generate synthesized feedback information, and an information holder which samples the synthesized feedback information during the on-period of the low-side switch.

According to one aspect of what is disclosed herein, a semiconductor integrated circuit device, which serves as a main controlling agent in a switching power supply that generates an output voltage from an input voltage, is built by integrating together a feedback terminal for receiving feedback input of the output voltage, a feedback voltage generation circuit which generates a feedback voltage commensurate with a terminal voltage at the feedback terminal, an output feedback controller which controls the duty of the switching power supply such that the feedback voltage remains equal to a predetermined reference voltage, and an open protector which varies the terminal voltage at the feedback terminal such that the on-duty of the switching power supply is lowered when the feedback terminal becomes open.

According to another aspect of what is disclosed herein, a semiconductor integrated circuit device, which serves as a main controlling agent in a switching power supply that generates an output voltage from an input voltage, is built by integrating together a feedback terminal for receiving feedback input of the output voltage, an output feedback controller which controls the duty of the switching power supply such that a terminal voltage at the feedback terminal remains equal to a predetermined reference voltage, and an open protector which varies the terminal voltage at the feedback terminal such that the on-duty of the switching power supply is lowered when the feedback terminal becomes open.

According to one aspect of what is disclosed herein, a differential input circuit includes a first differential input stage which receives a differential input signal with a pair of P-channel transistors, a second differential input stage which receives the differential input signal with a pair of N-channel transistors, and an input stage switcher which selectively makes one of the first and second differential input stages operate.

According to another aspect of what is disclosed herein, a differential input circuit includes: a differential input stage including a first differential input terminal for receiving a first differential input signal from a first signal source, and a second differential input terminal for receiving a second differential input signal from a second signal source which has a lower impedance than the first signal source; and a signal path switcher which, during start-up of the differential input stage, keeps the first differential input terminal disconnected from the first signal source and short-circuited to the second differential input terminal and, after start-up of the differential input stage, keeps the first differential input terminal disconnected from the second differential input terminal and connected to the first signal source.

Advantageous Effects of Invention

According to the invention disclosed herein, it is possible to provide a switching power supply that offers improved performance by eliminating a temporal discrepancy between voltage feedback information and current feedback information through sampling-and-holding after the adding-up of voltage feedback information and current feedback information.

With a switching power supply disclosed herein, it is possible to safely lower the output voltage when a feedback terminal becomes open.

With a differential input circuit disclosed herein, it is possible to achieve a wider input dynamic range or kickback prevention.

DESCRIPTION OF EMBODIMENTS

Switching Power Supply (Basic Configuration)

Figure 1:
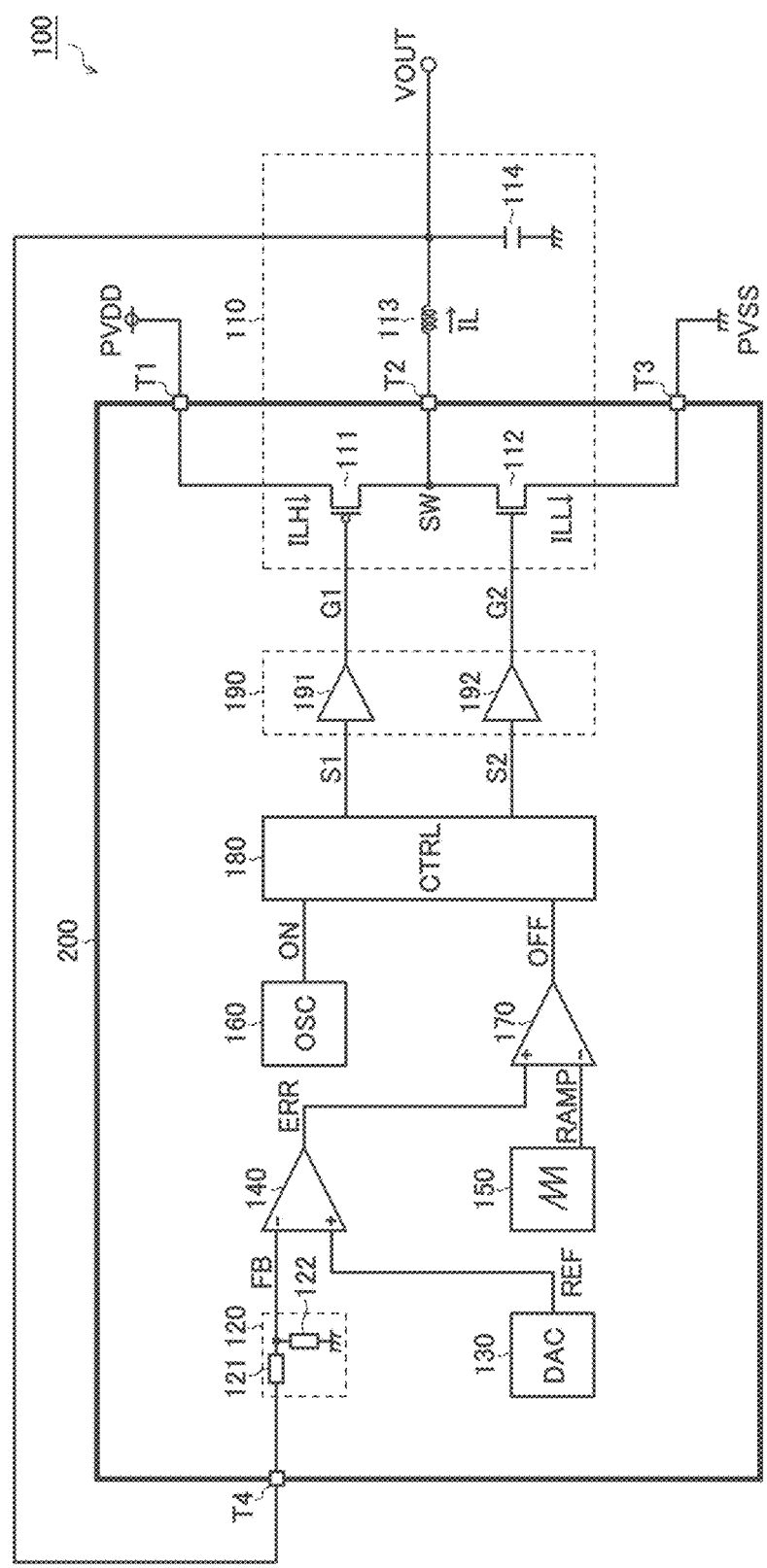
FIG. 1 is a diagram showing a basic configuration of a switching power supply.

FIG. 1 is a diagram showing a basic configuration of a switching power supply. The switching power supply 100 of this configuration example is a PWM (pulse width modulation) DC-DC converter that generates from an input voltage PVDD an output voltage VOUT to feed it to an unillustrated load. The switching power supply 100 includes a switching output circuit 110, a feedback voltage generation circuit 120, a reference voltage generation circuit 130, an error amplifier 140, a ramp signal generation circuit 150, an oscillator 160, a PWM comparator 170, a control circuit 180, and a switch driving circuit 190.

Preferably, the circuit elements mentioned above are, except some of them (an inductor 113 and a capacitor 114 in FIG. 1) included in the switching output circuit 110, integrated into a semiconductor integrated circuit device 200 (what is called a power control IC) that serves as the main controlling agent in the switching power supply 100. The semiconductor integrated circuit device 200 can have any circuit elements (such as various types of protection circuits) other than those enumerated above incorporated into it as necessary.

The semiconductor integrated circuit device 200 includes, as a means for establishing electrical connection with outside the device, a plurality of external terminals (FIG. 1 shows, as an example, four terminals, namely a power terminal T1, an output terminal T2, a ground terminal T3, and a feedback terminal T4).

The switching output circuit 110 is a bucking (step-down) switching output stage which, by turning on and off high-side and low-side switches that are connected together to form a half bridge, drives an inductor current IL to generate the output voltage VOUT from the input voltage PVDD. The switching output circuit 110 includes an output transistor 111, a synchronous rectification transistor 112, an inductor 113, and a capacitor 114.

The output transistor 111 is a PMOSFET (P-channel metal-oxide-semiconductor field-effect transistor) that functions as a high-side switch in the switching output stage. Inside the semiconductor integrated circuit device 200, the source of the output transistor 111 is connected to the power terminal T1 (that is, an application terminal for the input voltage PVDD). The drain of the output transistor 111 is connected to the output terminal T2 (that is, an application terminal for a switching voltage SW). The gate of the output transistor 111 is connected to an application terminal for a high-side gate signal G1. The output transistor 111 is off when the high-side gate signal G1 is at high level, and is on when the high-side gate signal G1 is at low level.

The synchronous rectification transistor 112 is an NMOS-FET (N-channel MOSFET) that functions as a low-side switch in the switching output stage. Inside the semiconductor integrated circuit device 200, the source of the synchronous rectification transistor 112 is connected to the ground terminal T3 (that is, an application terminal for a ground voltage PVSS). The drain of the synchronous rectification transistor 112 is connected to the output terminal T2. The gate of the synchronous rectification transistor 112 is connected to an application terminal for a low-side gate signal G2. The synchronous rectification transistor 112 is on when the low-side gate signal G2 is at high level, and is off when the low-side gate signal G2 is at low level.

The inductor 113 and the capacitor 114 are discrete components that are externally connected to the semiconductor integrated circuit device 200. The inductor 113 and the capacitor 114 form an LC filter that rectifies and smooths the switching voltage SW to generate the output voltage VOUT. Outside the semiconductor integrated circuit device 200, the first terminal of the inductor 113 is connected to the output terminal T2 of the semiconductor integrated circuit device 200. The second terminal of the inductor 113 and the first terminal of the capacitor 114 are connected to an application terminal for the output voltage VOUT and to the feedback terminal T4. The second terminal of the capacitor 114 is connected to a grounded terminal.

The output transistor 111 and the synchronous rectification transistor 112 are turned on an off complementarily in accordance with the high-side and low-side gate signals G1 and G2. Such on/off operation generates at the first terminal of the inductor 113 the switching voltage SW with a rectangular waveform that is pulse-driven between the input voltage PVDD and the ground voltage GND. Here, the term "complementarily" covers not only operation where the on/off states of the output transistor 111 and the synchronous rectification transistor 112 are completely reversed, but also operation where there is provided a period (a dead time) in which both transistors are simultaneously off.

The output type of the switching output circuit 110 is not limited to a bucking type as mentioned above; it may instead be any of a boosting (step-up) type, a boost/buck (step-up/down) type, and an inverting type. Likewise, the rectification type of the switching output circuit 110 is not limited to a synchronous rectification type as mentioned above; it may instead be a diode rectification type using a rectifier diode as the low-side switch.

The output transistor 111 can be replaced with an NMOS-FET. In that case, a bootstrap circuit or a charge pump circuit is needed to raise the high level of the high-side gate signal G1 up to a voltage value higher than the input voltage PVDD.

A configuration is also possible where the output transistor 111 and the synchronous rectification transistor 112 are externally connected to the semiconductor integrated circuit device 200. In that case, instead of the output terminal T2, terminals for feeding out the high-side and low-side gate signals G1 and G2 respectively are needed.

In particular in applications where a high voltage is applied to the switching output circuit 110, as the output transistor 111 and the synchronous rectification transistor 112, high-withstand-voltage elements can be used such as power MOSFETs, IGBTs (insulated-gate bipolar transistors), or SiC transistors.

The feedback voltage generation circuit 120 includes resistors 121 and 122 which are connected in series between the feedback terminal T4 (that is, the application terminal for the output voltage VOUT) and a grounded terminal. The feedback voltage generation circuit 120 yields from the connection node between the resistors a feedback voltage FB (that is, a division voltage of the output voltage VOUT) commensurate with the output voltage VOUT.

In a case where the output voltage VOUT is within the input dynamic range of the error amplifier 140, the feedback voltage generation circuit 120 may be omitted, in which case the output voltage VOUT can be fed directly to the error amplifier 140.

Yet another configuration is possible where the resistors 121 and 122 are externally connected to the semiconductor integrated circuit device 200. In that case, the connection node between the resistors 121 and 122 can be connected to the feedback terminal T4.

The reference voltage generation circuit 130 generates a predetermined reference voltage REF (corresponding to a set target value of the output voltage VOUT). For the reference voltage generation circuit 130, a DAC (digital-to-analog converter) can be used which converts a digital reference voltage setting signal to an analogue reference voltage REF. With this configuration, it is possible, by using the just-mentioned reference voltage setting signal, to achieve soft starting at start-up and to adjust the output voltage VOUT.

The error amplifier 140 generates an error signal ERR that is commensurate with the difference between the feedback voltage FB, which is fed to the inverting input terminal (−) of the error amplifier 140, and the reference voltage REF, which is fed to the non-inverting input terminal (+) of the error amplifier 140. The error signal ERR rises when the feedback voltage FB is lower than the reference voltage REF, and falls when the feedback voltage FB is higher than the reference voltage REF.

The ramp signal generation circuit 150 generates a ramp signal RAMP that rises during the on-period Ton of the output transistor 111 with a triangular waveform, a sawtooth-shaped waveform, or an nth-order slope waveform (e.g., n=2). The ramp signal RAMP, for example, starts to rise from a zero value at the turn-on of the output transistor 111, and is reset to a zero value at the turn-off of the output transistor 111.

The oscillator 160 generates an on signal ON (that is, a clock signal) that is pulse-driven at a predetermined switching frequency fsw (=1/Tsw).

The PWM comparator 170 generates an off signal OFF by comparing the error signal ERR, which is fed to the non-inverting input terminal (+) of the PWM comparator 170, with the ramp signal RAMP, which is fed to the inverting input terminal (−) of the PWM comparator 170. The off signal OFF is at high level when the ramp signal RAMP is lower than the error signal ERR, and is at low level when the ramp signal RAMP is higher than the error signal ERR. That is, the higher the error signal ERR, the later the occurrence of a pulse in the off signal OFF, and the lower the error signal ERR, the earlier the occurrence of a pulse in the off signal OFF.

The control circuit 180 generates a high-side control signal S1 and a low-side control signal S2 in accordance with the on signal ON and the off signal OFF. Specifically, the control circuit 180, when a pulse occurs in the on signal ON, turns both the high-side and low-side control signals S1 and S2 to low level (that is, the logic level that keeps the switching voltage SW at high level) and, when a pulse occurs in the off signal OFF, turns both the high-side and low-side control signals S1 and S2 to high level (that is, the logic level that keeps the switching voltage SW at low level).

Thus, the later the occurrence of a pulse in the off signal OFF, the longer the on-period Ton of the output transistor 111 (that is, the high-level period of the switching voltage SW); the earlier the occurrence of a pulse in the off signal OFF, the shorter the on-period Ton. That is, the higher the error signal ERR, the higher the on-duty D (=Ton/Tsw) of the output transistor 111, and the lower the error signal ERR, the lower the on-duty D.

The switch driving circuit 190 includes a high-side driver 191, which receives the high-side control signal S1 to generate the high-side gate signal G1, and a low-side driver 192, which receives the low-side control signal S2 to generate the low-side gate signal G2. For each of the high-side and low-side drivers 191 and 192, a buffer or an inverter can be used.

Of the circuit elements mentioned above, the error amplifier 140, the ramp signal generation circuit 150, the oscillator 160, the PWM comparator 170, the control circuit 180, and the switch driving circuit 190 can be understood as an output feedback controller that controls the duty of the switching power supply 100 to keep the feedback voltage FB equal to the predetermined reference voltage REF.

First Embodiment

Figure 2:
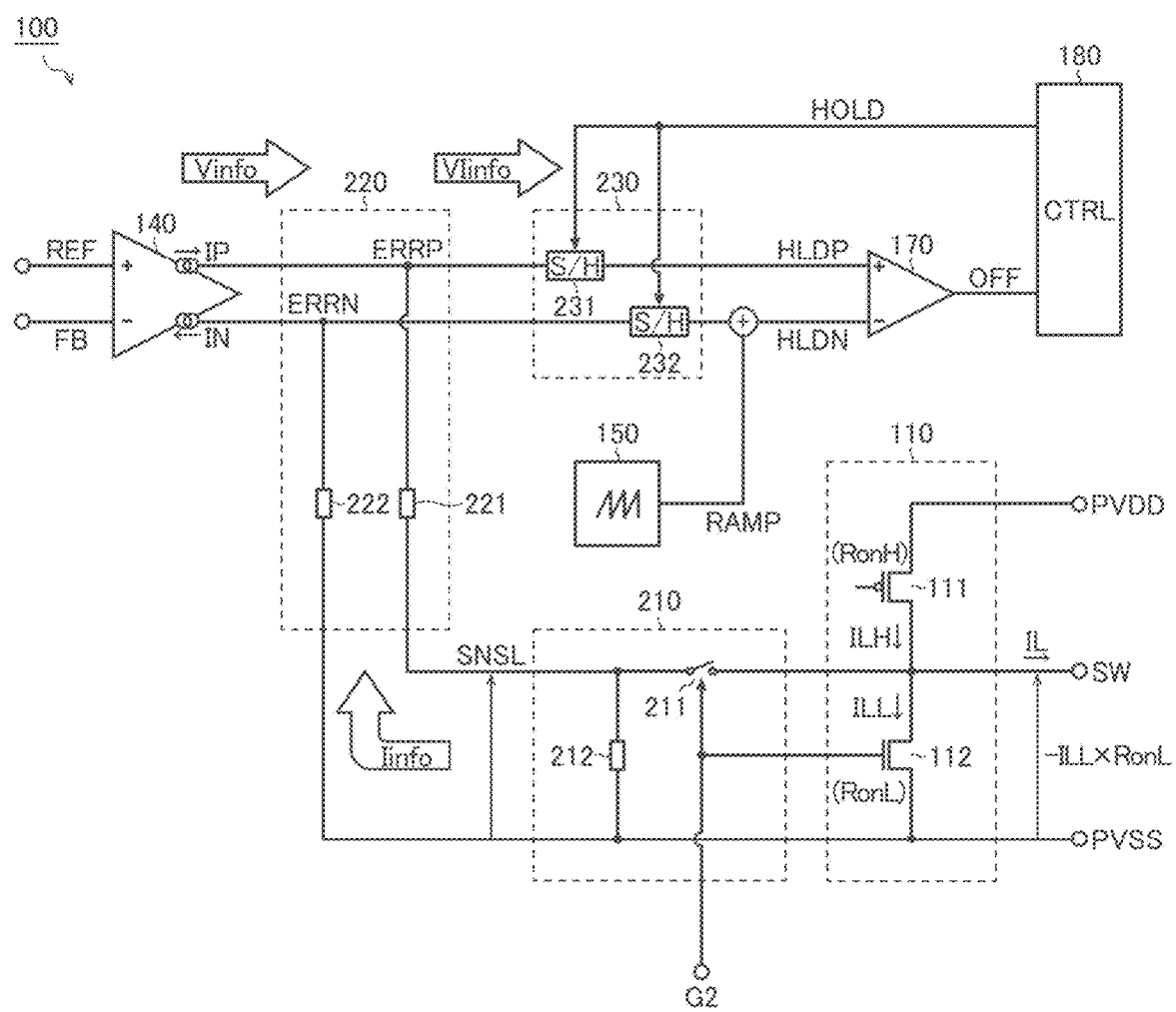
FIG. 2 is a diagram showing a switching power supply according to a first embodiment.

FIG. 2 is a diagram showing a switching power supply 100 according to a first embodiment. As a means for achieving output feedback control of a current mode control type, the switching power supply 100 of this embodiment includes, in addition to the circuit elements described previously (in FIG. 2, the switching output circuit 110, the error amplifier 140, the ramp signal generation circuit 150, the oscillator 160, the PWM comparator 170, and the control circuit 180 are expressly shown), a low-side current sensor 210, an information synthesizer 220, and an information holder 230.

In the switching power supply 100 of this embodiment, as the error amplifier 140 that acquires voltage feedback information Vinfo in accordance with the output voltage VOUT (and hence the feedback voltage FB), a current-output amplifier is used which outputs differential current signals IP and IN. The differential current signals IP and IN are currents that pass in opposite directions, and increase and decrease in accordance with the difference between the feedback voltage FB and the reference voltage REF.

More specifically, the differential current signal IP behaves such that, when REF>FB, the larger the difference between the two voltages, the larger the differential current signal IP in the positive direction (the direction in which the current passes out of the error amplifier 140) and that, when REF<FB, the larger the difference between the two voltages, the larger the differential current signal IP in the negative direction (the direction in which the current passes into the error amplifier 140).

In contrast, contrary to the differential current signal IP, the differential current signal IN behaves such that, when REF>FB, the larger the difference between the two voltages, the larger the differential current signal IN in the negative direction and that, when REF<FB, the larger the difference between the two voltages, the larger the differential current signal IN in the positive direction.

The low-side current sensor 210 includes a switch 211 and a resistor 212, and senses the inductor current IL (hereinafter referred to as the low-side inductor current ILL) which passes through the synchronous rectification transistor 112 to acquire current feedback information Iinfo.

The first terminal of the switch 211 is connected to the drain of the synchronous rectification transistor 112 (that is, an application terminal for the switching voltage SW). The second terminal of the switch 211 is connected to the first terminal of the resistor 212. The second terminal of the resistor 212 is connected to the source of the synchronous rectification transistor 112 (that is, an application terminal for the ground voltage PVSS).

The switch 211 is, in accordance with the low-side gate signal G2, turned on and off along with the synchronous rectification transistor 112. More specifically, the switch 211 is on during the on-period of the synchronous rectification transistor 112, and is off during the off-period of the synchronous rectification transistor 112.

Thus, during the on-period of the synchronous rectification transistor 112, as the current feedback information Iinfo mentioned previously, a low-side sense signal SNSL (=SW−PVSS=−ILL×RonL, where RonL is the on-resistance of the synchronous rectification transistor 112) which reflects the low-side inductor current ILL is transmitted to the information synthesizer 220. On the other hand, during the off-period of the synchronous rectification transistor 112, the low-side sense signal SNSL is fixed at a zero value via the resistor 212, and thus the high level of the switching voltage SW (≈PVDD) is not transmitted to the information synthesizer 220.

The low-side inductor current ILL can be sensed by any method other than one involving the sensing of the drain-source voltage of the synchronous rectification transistor 112. For example, the terminal-to-terminal voltage across a sense resistor that is connected in series with the synchronous rectification transistor 112 can be sensed, or the drain-source voltage of a transistor for current sensing that is connected in parallel with the synchronous rectification transistor 112 can be sensed.

The information synthesizer 220 includes resistors 221 and 222 (both with a resistance value R), and generates synthesized feedback information VIinfo by combining the voltage feedback information Vinfo acquired by the error amplifier 140 with the current feedback information Iinfo acquired by the low-side current sensor 210.

The first terminal of the resistor 221 is connected to the first output terminal of the error amplifier 140 (that is, an output terminal for the differential current signal IP). The second terminal of the resistor 221 is connected to the first output terminal of the low-side current sensor 210 (that is, an output terminal for the low-side sense signal SNSL).

The first terminal of the resistor 222 is connected to the second output terminal of the error amplifier 140 (that is, an output terminal for the current signal IN). The second terminal of the resistor 222 is connected to the second output terminal of the low-side current sensor 210 (that is, an application terminal for the ground voltage PVSS).

Here, the positive-side differential error signal (a voltage signal) which is output from the first terminal of the resistor 221 can be given by the formula ERRP=IP×R+SW. The negative-side differential error signal (a voltage signal) which is output from the first terminal of the resistor 222 can be given by the formula ERRN=IN×R+PVSS (where IN=−IP).

Thus, the differential signal between the differential error signals ERRP and ERRN can be expressed by the formula ERRP−ERRN=2IP×R−ILL×RonL. Here, the first term on the right side (2IP×R) can be understood as the voltage feedback information Vinfo that is acquired by the error amplifier 140. Likewise, the second term on the right side (−ILL×RonL) can be understood as the current feedback information Iinfo that is acquired by the low-side current sensor 210. Thus, the differential signal mentioned above (ERRP−ERRN) can be understood as the synthesized feedback information VIinfo resulting from combining the voltage feedback information Vinfo with the current feedback information Iinfo.

The information holder 230 receives differential input of the synthesized feedback information VIinfo, and includes a pair of sample and hold circuits 231 and 232 for sampling, during the on-period of the synchronous rectification transistor 112, the low-side peak value of the inductor current IL and for holding and outputting, during the on-period of the output transistor 111, differential hold signals HLDP and HLDN.

The sample and hold circuit 231 samples the differential error signal ERRP in accordance with the sample and hold control signal HOLD from the control circuit 180 during the on-period of the synchronous rectification transistor 112, and holds and outputs the differential hold signal HLDP during the on-period of the output transistor 111.

The sample and hold circuit 232 samples the differential error signal ERRN in accordance with the sample and hold control signal HOLD from the control circuit 180 during the on-period of the synchronous rectification transistor 112, and holds and outputs the differential hold signal HLDN during the on-period of the output transistor 111.

The PWM comparator 170, during the on-period of the output transistor 111, compares the ramp signal RAMP, which is fed to the inverting input terminal (−) of the PWM comparator 170 (more precisely, the differential hold signal HLDN with the ramp signal RAMP added to it), with the differential hold signal HLDP, which is fed to the non-inverting input terminal (+) of the PWM comparator 170, to generate an off signal OFF, and thereby determines the turn-off time point of the output transistor 111.

With the switching power supply 100 of this embodiment, it is possible to achieve output feedback control of the current mode control type, and thus it is possible to enhance the load response of the output voltage VOUT.

In particular, with a configuration that senses, instead of the inductor current IL passing through the output transistor 111 (hereinafter, referred to as the high-side inductor current ILH), the low-side inductor current ILL passing through the synchronous rectification transistor 112, even when the on-period of the output transistor 111 is short (for example, under high-voltage input or low-voltage output), it is possible to perform output feedback control of the current mode control type with no trouble.

For output feedback control of the current mode control type using the current feedback information Iinfo reflecting the low-side inductor current ILL, the information holder 230 (sample and hold circuits 231 and 232) is needed to hold the current feedback information Iinfo acquired during the on-period of the synchronous rectification transistor 112 (that is, during the off-period of the output transistor 111).

Here, the information holder 230 is provided between the information synthesizer 220 and the PWM comparator 170 and holds the synthesized feedback information VIinfo that results from combining the voltage feedback information Vinfo with the current feedback information Iinfo.

With this configuration, during the hold-and-output period of the information holder 230, even when noise is introduced in the stage preceding the information holder 230, it has no effect on signal comparison in the PWM comparator 170. This permits stable duty control.

In addition, by adding up the voltage feedback information Vinfo and the current feedback information Iinfo and then sampling and holding the result, it is possible to prevent a time-related discrepancy between the voltage feedback information Vinfo and the current feedback information Iinfo and thereby to improve the performance of the switching power supply 100.

Incidentally, in a case where output feedback control of the current mode control type is performed using not the average value but the peak value of the inductor current IL, consideration should be given to prevention of subharmonic oscillation in the operation region where the on-duty D of the output transistor 111 is equal to or higher than 50%. This will now be studied with reference to a relevant drawing.

Figure 3:
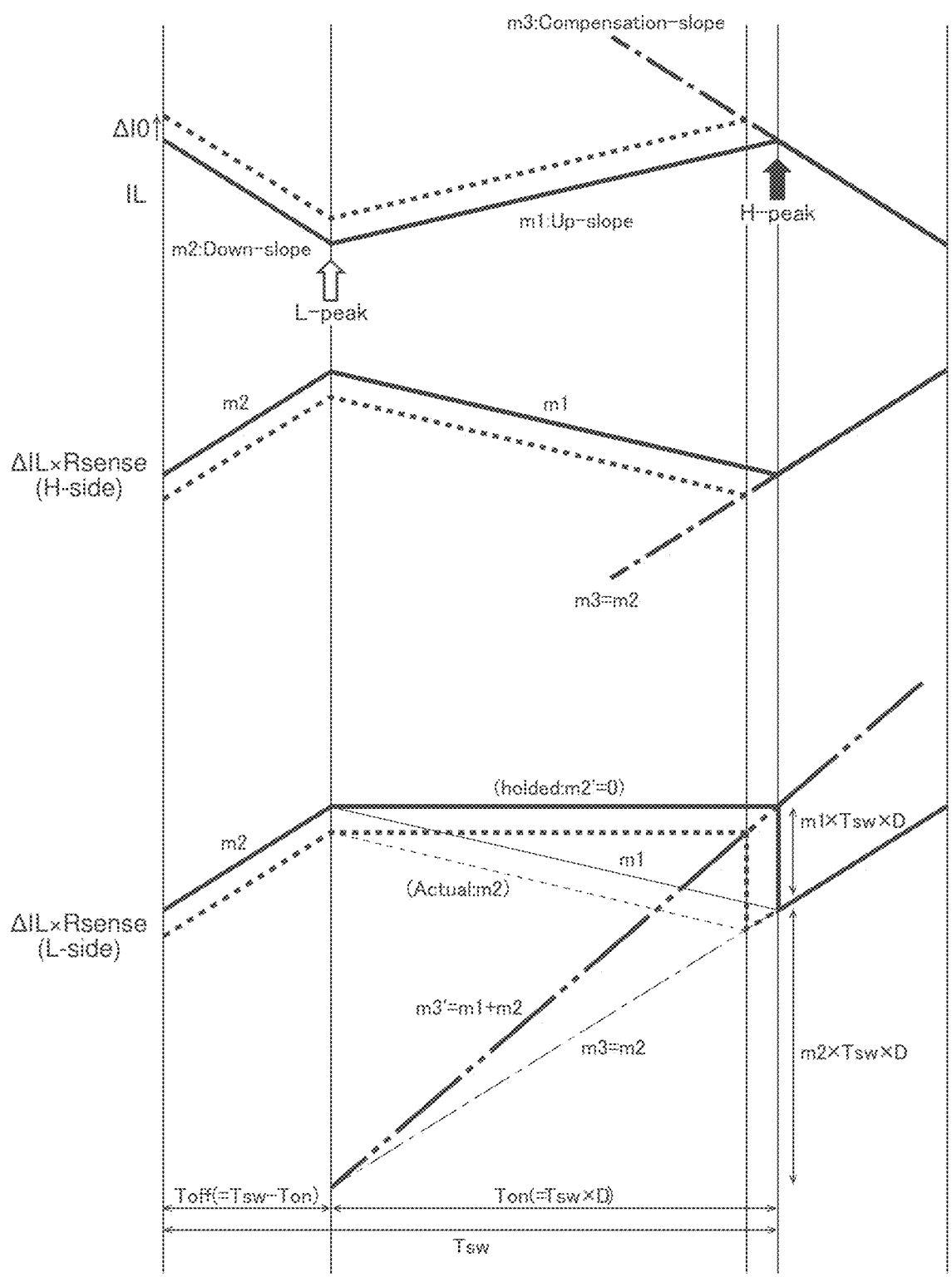
FIG. 3 is a diagram showing conditions for preventing subharmonic vibration.

FIG. 3 is a diagram showing conditions for preventing subharmonic oscillation, illustrating, from top down, the inductor current IL and the sense signals ΔIL×Rsense (the middle tier showing a case where the high-side peak value of the inductor current IL is detected, the bottom tier showing a case where the low-side peak value of the inductor current IL is detected). Solid and broken lines in the diagram show what is observed when the inductor current IL varies by ΔI0. A dash-dot line and a dash-dot-dot line show the ramp signal RAMP (the dash-dot line showing a case where the high-side peak value of the inductor current IL is detected and the dash-dot-dot line showing a case where the low-side peak value of the inductor current IL is detected).

In the following description, the rising gradient of the inductor current IL during the on-period Ton (=Tsw×D) of the output transistor 111 is represented by m1, the falling gradient of the inductor current IL during the off-period Toff (=Tsw−Ton) of the output transistor 111 is represented by m2 and m2', and the compensation gradient of the ramp signal RAMP during the on-period Ton of the output transistor 111 is represented by m3 and m3'.

First, a description will be given of a case where the high-side peak value of the inductor current IL (see the solid arrow in the diagram) is detected. In this case, the current waveform of the inductor current IL is taken basically as it is as the sense signal ΔIL×Rsense. Thus, the condition for subharmonic oscillation to subside with one-time switching is m3=m2.

As is well known, the falling gradient m2 of the inductor current IL depends on both the input voltage PVDD and the output voltage VOUT. Thus, to prevent subharmonic oscillation, it is necessary to vary the compensation gradient m3 of the ramp signal RAMP in a way that it depends on both the input voltage PVDD and the output voltage VOUT.

Next, a description will be given of a case where the low-side peak value of the inductor current IL (see the hollow arrow in the diagram) is detected. In this case, during the on-period Ton of the output transistor 111, the low-side peak value of the inductor current IL sampled during the preceding off-period Toff is held and crosses the ramp signal RAMP.

Needless to say, the held sense signal ΔIL×Rsense has a waveform different from that which it has when the inductor current IL is taken as it is. Thus, it is necessary to correct the compensation gradient m3 of the ramp signal RAMP so that there is no deviation in the time point at which the ramp signal RAMP is crossed.

Specifically, considering that the sense signal ΔIL×Rsense is held instead of falling during the on-period Ton of the output transistor 111, the compensation gradient m3 of the ramp signal RAM can be increased by as much as the magnitude of the fall (=m1×Tsw×D).

Considering that the condition for subharmonic oscillation to subside on detection of the high-side peak value is m3=m2, it can be understood that, on detection of the low-side peak value, the corrected compensation gradient m3' can be set such that m3'=m1+m2.

Here, the rising gradient m1 of the inductor current IL depends positively on the output voltage VOUT. By contrast, the falling gradient m2 of the inductor current IL depends on both the input voltage PVDD and the output voltage VOUT and, in particular, depends negatively on the output voltage VOUT.

Thus, in the corrected compensation gradient m3' (=m1+m2), the dependence on the output voltage VOUT is canceled out. Thus, the compensation gradient m3' of the ramp signal RAMP has only to be varied such that it depends on the input voltage PVDD, and does not need to be varied such that it depends on the output voltage VOUT.

In this way, with the configuration where output feedback control of the current mode control type is performed by sampling and holding the low-side peak value of the inductor current IL, it is possible to eliminate from the compensation gradient m3' of the ramp signal RAMP the dependence on the output voltage VOUT. Thus, it is possible to simplify the configuration of the ramp signal generation circuit 150.

The information holder 230 does not necessarily need to be provided between the information synthesizer 220 and the PWM comparator 170. Subharmonic oscillation can also be prevented by, for example, providing the information holder 230 between the low-side current sensor 210 and the information synthesizer 220.

Second Embodiment

Figure 4:
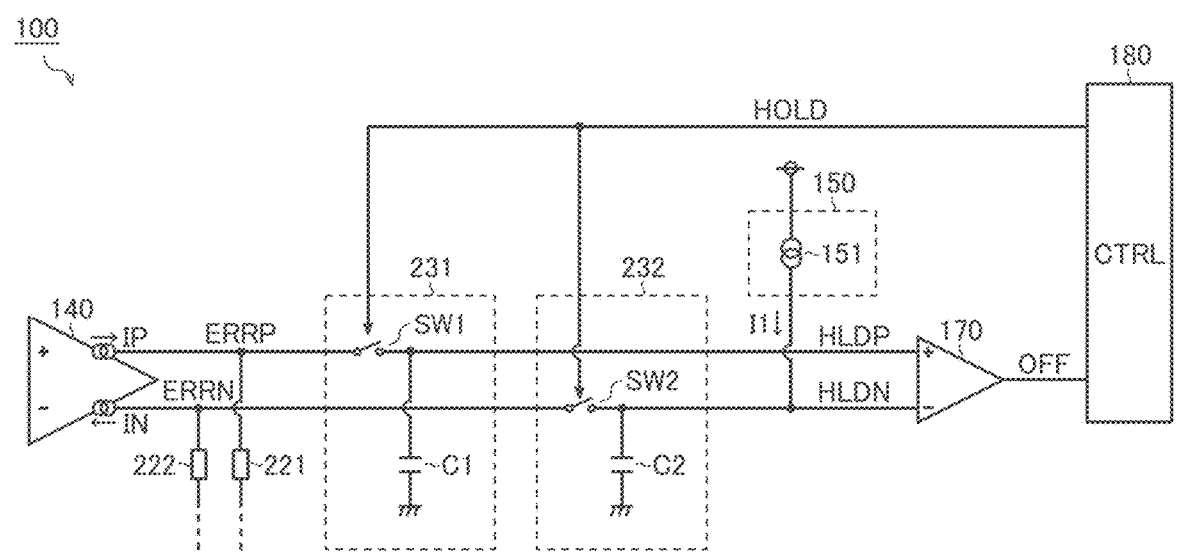
FIG. 4 is a diagram showing a switching power supply according to a second embodiment.

FIG. 4 is a diagram showing a switching power supply 100 according to a second embodiment. In the switching power supply 100 of this embodiment, which is based on the first embodiment (FIG. 2), the sample and hold circuits 231 and 232 and the ramp signal generation circuit 150 are given more specific configurations.

The sample and hold circuit 231 includes a switch SW1 and a capacitor C1. The first terminal of the switch SW1 is connected to an application terminal for the differential error signal ERRP. The connection node between the second terminal of the switch SW1 and the first terminal of the capacitor C1 is, as an output terminal for the differential hold signal HLDP, connected to the non-inverting input terminal (+) of the PWM comparator 170. The second terminal of the capacitor C1 is connected to a grounded terminal. In accordance with the sample and hold control signal HOLD from the control circuit 180, the switch SW1 is on during the sampling period of the differential error signal ERRP, and is off during the hold-and-output period of the differential hold signal HLDP.

The sample and hold circuit 232 includes a switch SW2 and a capacitor C2. The first terminal of the switch SW2 is connected to an application terminal for the differential error signal ERRN. The connection node between the second terminal of the switch SW2 and the first terminal of the capacitor C2 is, as an output terminal for the differential hold signal HLDN, connected to the inverting input terminal (−) of the PWM comparator 170. The second terminal of the capacitor C2 is connected to a grounded terminal. In accordance with the sample and hold control signal HOLD from the control circuit 180, the switch SW2 is on during the sampling period of the differential error signal ERRN, and is off during the hold-and-output period of the differential hold signal HLDN.

The ramp signal generation circuit 150 includes a current source 151 which feeds a constant current I1 into the capacitor C2 in the sample and hold circuit 232. It is preferable that the error amplifier 140 have a current capacity higher than that of the current source 151. For example, the differential current signals IP and IN can be set at several tens of microamperes (for example, 80 µA) and the constant current I1 can be set at several hundred nanoamperes (for example, 300 nA). The capacitor C2 can be set at several picofarads (for example, 1 pF).

Figure 5:
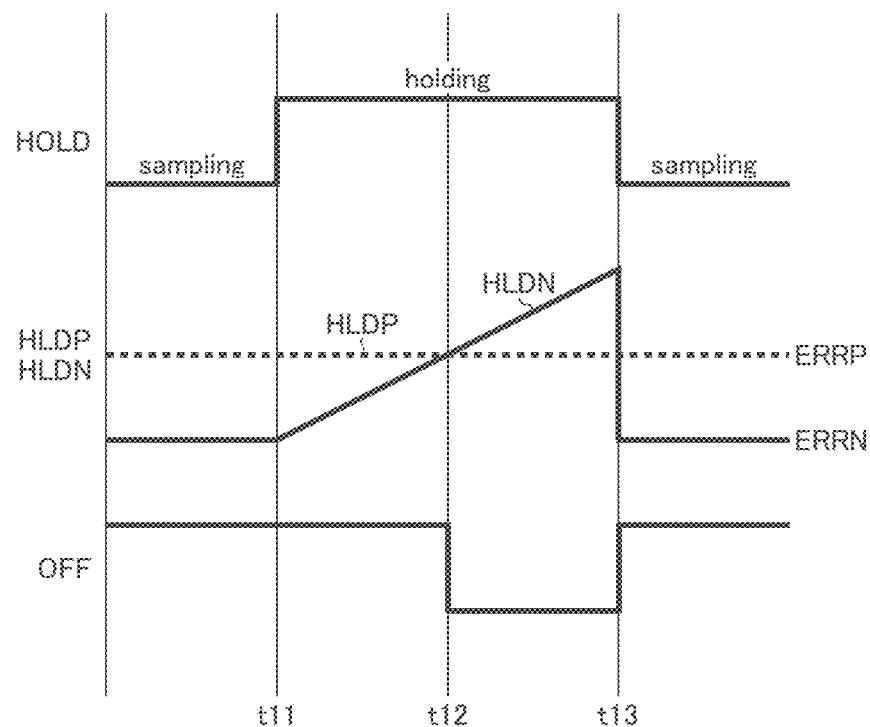
FIG. 5 is a diagram showing operation for generating a ramp signal.

FIG. 5 is a diagram showing operation for generating the ramp signal RAMP, illustrating, from top down, the sample and hold control signal HOLD, the differential hold signals HLDP and HLDN, and the off signal OFF.

Before time point t11, the sample and hold control signal HOLD is at low level (that is, the logic level during the sampling period). Then, the switches SW1 and SW2 both turn on. As a result, the differential hold signals HLDP and HLDN become equal to the differential error signals ERRP and ERRN respectively.

When the current capacity of the error amplifier 140 is well higher than the current capacity of the current source 151, during the on-period of the switch SW2, charging and discharging of the capacitor C2 with the differential current signal IN is more dominant than charging of the capacitor C2 with the constant current I1. That is, even with the constant current I1 kept passing, HLDN remains approximately equal to ($\approx$) ERRN. This eliminates the need for on/off control on the constant current I1, and helps simplify the configuration of the ramp signal generation circuit 150.

When, at time point t11, the sample and hold control signal HOLD is raised to high level (that is, the logic level during the hold-and-output period), the switches SW1 and SW2 both turn off. Then, the differential error signal ERRP that has just been sampled is held and output as the differential hold signal HLDP (that is, the charge voltage across the capacitor C1).

On the other hand, the differential hold signal HLDN (that is, the charge voltage across the capacitor C2), while taking the differential error signal ERRN that has just been sampled as a reference value (that is, the lowest value), rises as the time elapses with a gradient reflecting the constant current I1. That is, the differential hold signal HLDN during the hold-and-output period has a waveform resulting from adding up the sampled differential error signal ERRN and the ramp signal RAMP (that is, the charge voltage produced by the constant current I1).

Similarly, by connecting a current source to the differential hold signal HLDP, it is possible, due to the difference in the magnitude of rise between the differential hold signals HLDP and HLDN, to subtract the ramp signal RAMP.

In this way, using the capacitor C2 in the sample and hold circuit 232 also as a means for generating the ramp signal RAMP makes it possible, by simply providing a current source 151, to generate the ramp signal RAMP easily.

To prevent subharmonic oscillation, the constant current I1 can be varied in accordance with the input voltage PVDD such that the condition shown back in FIG. 3 (m3'=m1+m2) is met.

At time point t12, when the differential hold signal HLDN becomes higher than the differential hold signal HLDP, the off signal OFF falls from high level to low level. The fall time point of the off signal OFF corresponds to the turn-off time point of the output transistor 111.

When, at time point t13, the sample and hold control signal HOLD is dropped to low level, the switches SW1 and SW2 turn on again. As a result, the differential hold signals HLDP and HLDN become equal to the differential error signals ERRP and ERRN respectively.

As mentioned previously, if the current capacity of the error amplifier 140 is well higher than the current capacity of the current source 151, when the switch SW2 turns on, even with the constant current I1 kept passing, HLDN is approximately equal to ($\approx$) ERRN. This eliminates the need for reset control on the ramp signal RAMP, and helps simplify the configuration of the ramp signal generation circuit 150.

Third Embodiment

Figure 6:
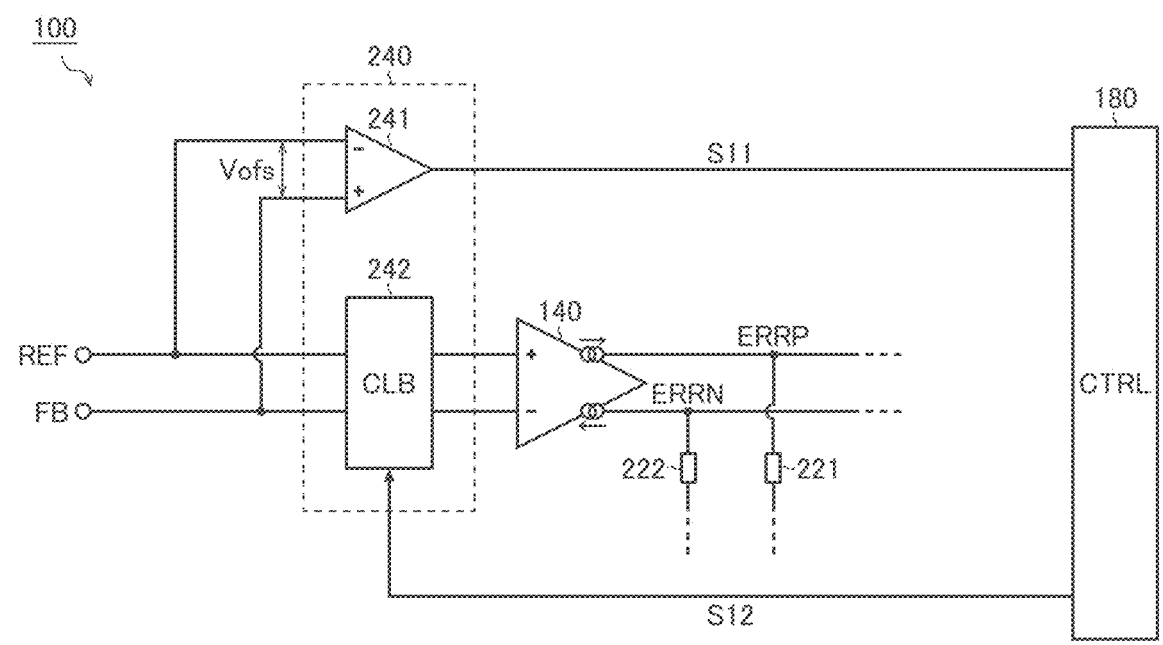
FIG. 6 is a diagram showing a switching power supply according to a third embodiment.

FIG. 6 is a diagram showing a switching power supply 100 according to a third embodiment. The switching power supply 100 according to this embodiment, while being based on the basic configuration (FIG. 1), the first embodiment (FIG. 2), or the second embodiment (FIG. 4), all described previously, further includes an error corrector 240 that detects an input error Vofs (=FB−REF) in the error amplifier 140, which includes no integrating element, to correct the input signals to the error amplifier 140 (that is, at least one of the feedback voltage FB and the reference voltage REF). The error corrector 240 includes a comparator 241 and a digital calibrator 242.

The comparator 241 is a means for detecting an input error Vofs (=FB−REF) in the error amplifier 140. The comparator 241 compares the feedback voltage FB, which is fed to the non-inverting input terminal (+) of the error amplifier 140, with the reference voltage REF, which is fed to the inverting input terminal (−) of the error amplifier 140, to generate an input error detection signal S11. The input error detection signal S11 is at high level when FB>REF (Vofs>0), and is at low level when FB<REF (Vofs<0).

The control circuit 180, based on the input error detection signal S11, generates a digital calibration signal S12 so as to reduce the input error Vofs. For example, when the input error detection signal S11 is at high level, the digital calibration signal S12 can be generated so that the feedback voltage FB is lowered or/and the reference voltage REF is raised. By contrast, when the input error detection signal S11 is at low level, the digital calibration signal S12 can be generated so that the feedback voltage FB is raised or/and the reference voltage REF is lowered.

The digital calibrator 242, in accordance with the digital calibration signal S12, corrects at least one of the feedback voltage FB and the reference voltage REF. Suitably used as the digital calibrator 242 is, for example, a DAC. A configuration is also possible where the input error detection signal S11 is fed directly to the digital calibrator 242 and the digital calibration signal S12 is generated inside it. In this case, correction of the input error Vofs can be completed with the error corrector 240 alone, without requiring the control circuit 180.

Next, the significance of introducing the error corrector 240 will be described in detail.

A common error amplifier has, as an integrating element, a capacitor (of, for example, several tens of picofarads) for phase compensation and generates an error signal by charging and discharging the capacitor. This helps reduce the likelihood of oscillation but results in a limited signal bandwidth, making such an error amplifier unsuitable for achieving a high-speed voltage feedback control loop. On the other hand, eliminating an integrating element from an error amplifier helps achieve a high-speed voltage feedback control loop but, as a trade-off, makes it difficult to cancel out an input error in the error amplifier.

As a solution, the switching power supply 100 of this embodiment, while accelerating the voltage feedback control loop (from several tens of kilohertz to several megahertz) by using an error amplifier 140 which includes no integrating element, employs, separately from the error amplifier 140, an error corrector 240 for correcting an input error Vofs in the error amplifier 140.

Parallelizing high-speed voltage feedback and error correction in that way helps separate the design parameters for them, and this helps achieve a high-speed and simultaneously accurate voltage feedback control loop. Unlike common error amplifiers, no capacitor for phase compensation is required, and thus it is also possible to reduce the area of the chip and the number of pins.

Fourth Embodiment

Figure 7:
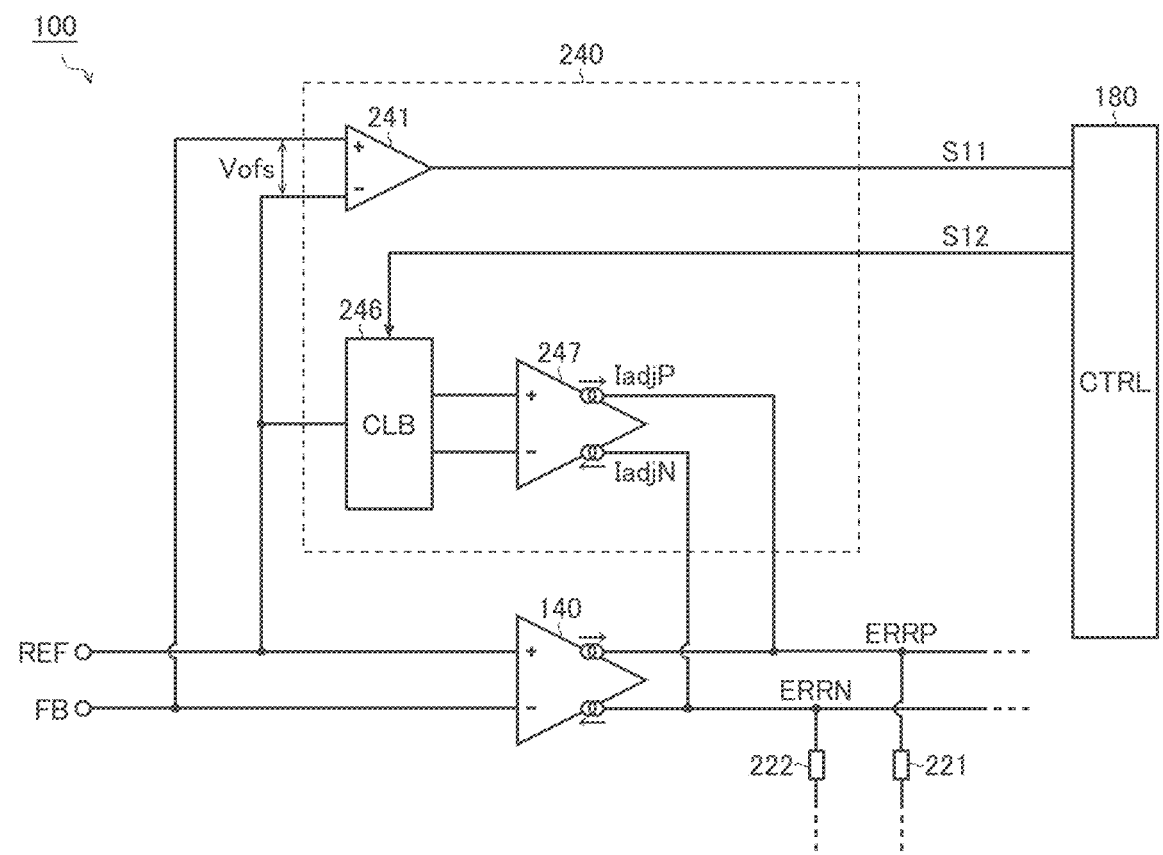
FIG. 7 is a diagram showing a switching power supply according to a fourth embodiment.

FIG. 7 is a diagram showing a switching power supply 100 according to a fourth embodiment. The switching power supply 100 of this embodiment, like that of the third embodiment (FIG. 6) described previously, includes an error corrector 240, which here has a different circuit configuration.

More specifically, the error corrector 240 in this embodiment includes, in addition to the comparator 241 mentioned previously, a digital calibrator 246 and an error correction amplifier 247. The error corrector 240 detects an input error Vofs in the error amplifier 140 and corrects the output signals (error signals ERRP and ERRN) from the error amplifier 140.

The digital calibrator 246, in accordance with the digital calibration signal S12, generates from the reference voltage REF differential input signals to the error correction amplifier 247.

The error correction amplifier 247 generates correction currents IadjP and IadjN in accordance with the differential input signals from the digital calibrator 246 and adds the correction currents IadjP and IadjN respectively to the differential current signals IP and IN from the error amplifier 140.

In this way, also with a configuration where not the input signals to the error amplifier 140 but the output signals from the error amplifier 140 are corrected, it is possible to achieve a high-speed and simultaneously accurate voltage feedback control loop.

Fifth Embodiment

Figure 8:
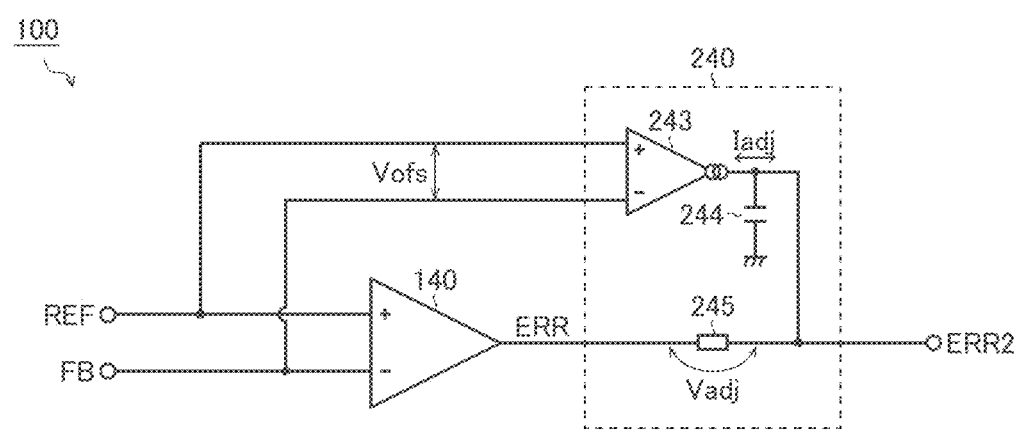
FIG. 8 is a diagram showing a switching power supply according to a fifth embodiment.

FIG. 8 is a diagram showing a switching power supply 100 according to a fifth embodiment. The switching power supply 100 of this embodiment, like those of the third and fourth embodiments (FIGS. 6 and 7) described previously, includes an error corrector 240, which here has a different circuit configuration.

More specifically, the error corrector 240 in this embodiment includes an error correction amplifier 243, a capacitor 244, and a resistor 245. The error corrector 240 detects an input error Vofs in the error amplifier 140 and corrects the output signal (that is, an error signal ERR) from the error amplifier 140.

In this embodiment, for the sake of simple description, an error amplifier 140 of a single output type is taken as an example. Instead, as in the first and second embodiments (FIGS. 2 and 4) described previously, the error amplifier 140 may be of a differential output type.

The error correction amplifier 243 generates a correction current Iadj commensurate with the difference (that is, the input error Vofs) between the feedback voltage FB, which is fed to the inverting input terminal (−) of the error correction amplifier 243, and the reference voltage REF, which is fed to the non-inverting input terminal (+) of the error correction amplifier 243. When FB<REF (that is, Vofs>0), the larger the difference between the two voltages, the larger the correction current Iadj in the positive direction (that is, the direction leading from the output terminal of the error correction amplifier 243 via the resistor 245 to the output terminal of the error amplifier 140). On the other hand, when FB>REF (that is, Vofs<0), the larger the difference between the two voltages, the larger the correction current Iadj in the negative direction (that is, the direction leading from the output terminal of the error amplifier 140 via the resistor 245 to the output terminal of the error correction amplifier 243.

Here, the error correction amplifier 243 is connected in parallel with the error amplifier 140 solely as a means for correcting the input error Vofs, and the current capacity of the error correction amplifier 243 is kept sufficiently lower (to, for example, several microamperes) than that of the error amplifier 140. To the output terminal of the error correction amplifier 243, a capacitor 244 of a low capacitance (for example, several picofarads) is connected. That is, the error correction amplifier 243 is an amplifier of a current output type incorporating an integrating element, with a processing speed slower than that of the error amplifier 140.

The resistor 245 (with a resistance value Radj) is connected between the output terminal of the error amplifier 140 and the output terminal of the error correction amplifier 243. The terminal-to-terminal voltage across the resistor 245 is, as the correction voltage Vadj (=Iadj×Radj), added to the error signal ERR to generate a corrected error signal ERR2 (=ERR+Vadj).

For example, when FB<REF, the correction current Iadj flows in the positive direction, and thus the error signal ERR is raised by the correction voltage Vadj. As a result, the off-timing of the output transistor 111 delays by the period commensurate with the rise of the corrected error signal ERR2, and thus the output voltage VOUT (and hence the feedback voltage FB) rises to reduce the input error Vofs.

On the other hand, when FB>REF, the correction current Iadj flows in the negative direction, and thus the error signal ERR is lowered by the correction voltage Vadj. As a result, the off-timing of the output transistor 111 advances by the period commensurate with the fall of the corrected error signal ERR2, and thus the output voltage VOUT (and hence the feedback voltage FB) falls to reduce the input error Vofs.

In this way, by connecting the error correction amplifier 243 in parallel with the error amplifier 140, as with the third and the fourth embodiments, it is possible to achieve a high-speed and simultaneously accurate voltage feedback control loop.

Sixth Embodiment

Figure 9:
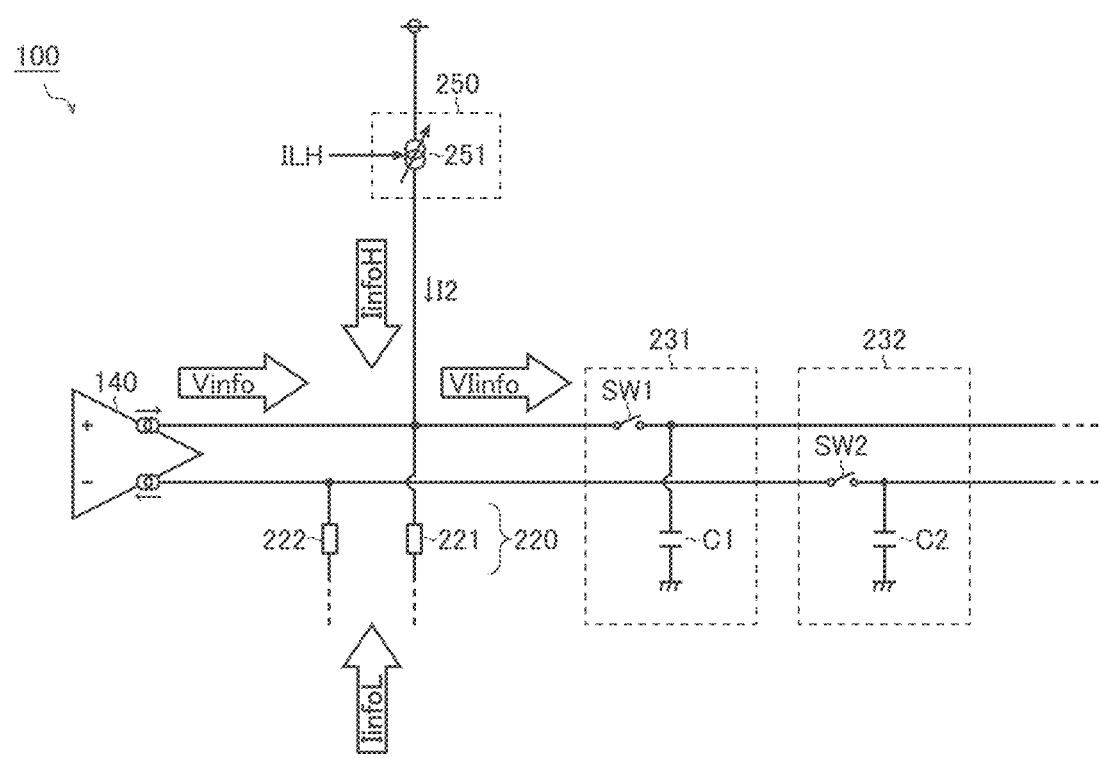
FIG. 9 is a diagram showing a switching power supply according to a sixth embodiment.

FIG. 9 is a diagram showing a switching power supply 100 according to a sixth embodiment. The switching power supply 100 of this embodiment, while being based on the first or second embodiment (FIG. 2 or 4), further includes a high-side current sensor 250.

The high-side current sensor 250 senses a high-side inductor current ILH that passes though the output transistor 111 to acquire high-side current feedback information IinfoH. In particular, the high-side current sensor 250 includes a current source 251 that generates a variable current I2 in accordance with the high-side inductor current ILH. The high-side current sensor 250 feeds, as the high-side current feedback information IinfoH, the variable current I2 into the resistor 221 in the information synthesizer 220. The high-side inductor current ILH can be sensed as, for example, a high-side sense signal SNSH (=PVDD−SW=ILH×RonH, where RonH is the on-resistance of the output transistor 111) which appears between the drain and the source of the output transistor 111.

The information synthesizer 220 combines the voltage feedback information Vinfo with the high-side current feedback information IinfoH as well as low-side current feedback information IinfoL (the latter two corresponding to the current feedback information Iinfo in FIG. 2) to generate a synthesized feedback information VIinfo.

According to this embodiment, simply by feeding the variable current I2 commensurate with the high-side inductor current ILH into the resistor 221, it is possible to easily synthesize not only the low-side current feedback information IinfoL but also the high-side current feedback information IinfoH into the voltage feedback information Vinfo.

Figure 10:
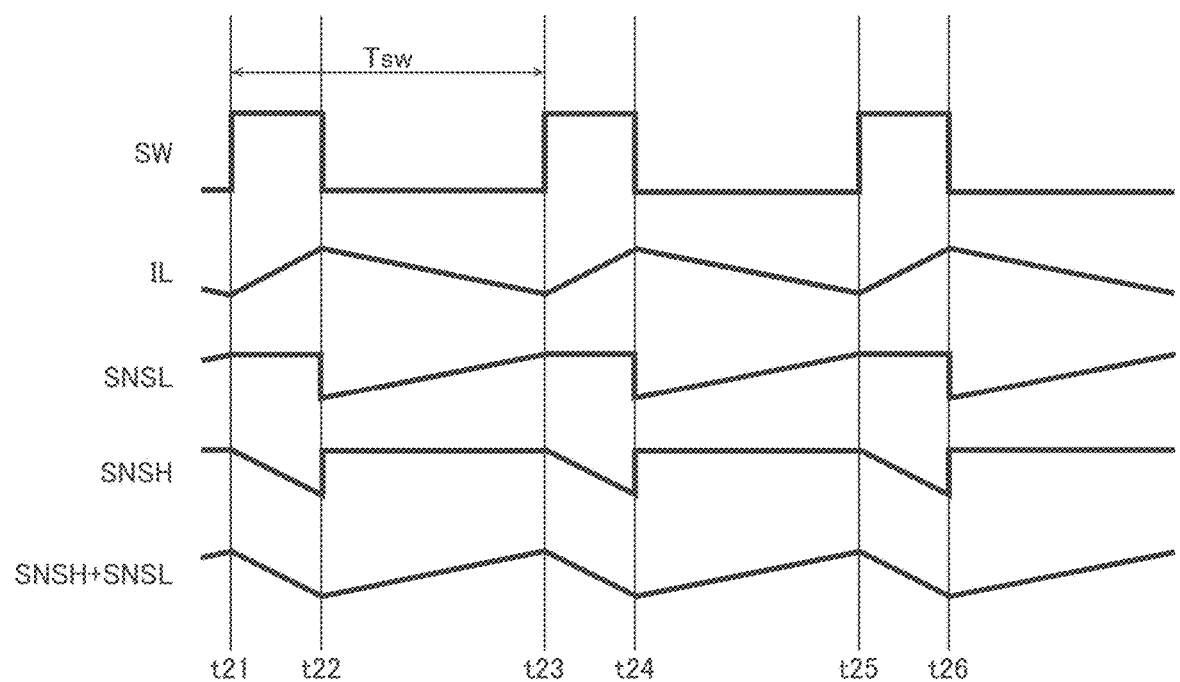
FIG. 10 is a diagram showing operation for sensing an inductor current.

FIG. 10 is a diagram showing the operation for sensing the inductor current IL, illustrating, from top down, the switching voltage SW, the inductor current IL, the low-side sense signal SNSL, the high-side sense signal SNSH, and the synthesized sense signal (SNSH+SNSL).

As shown in FIG. 10, by not only sensing the low-side sense signal SNSL during the low-level periods of the switching voltage SW (see between time points t22 and t23, and between t24 and t25) but also sensing the high-side sense signal SNSH during the high-level periods of the switching voltage SW (between time points t21 and t22, between t23 and t24, and between t25 and t26), it is possible to integrate together the two signals to generate the synthesized sense signal (SNSH+SNSL).

As a result, it is possible, throughout the switching period Tsw, to acquire the waveform of the inductor current IL continuously and to reflect it in output feedback control of a current mode control type. The switching power supply 100 is a system provided with both a function of extending the on-period Ton and a function of extending the off-period Toff (=Tsw−Ton). This embodiment is particularly effective when the function of extending the on-period Ton is provided.

Figure 11:
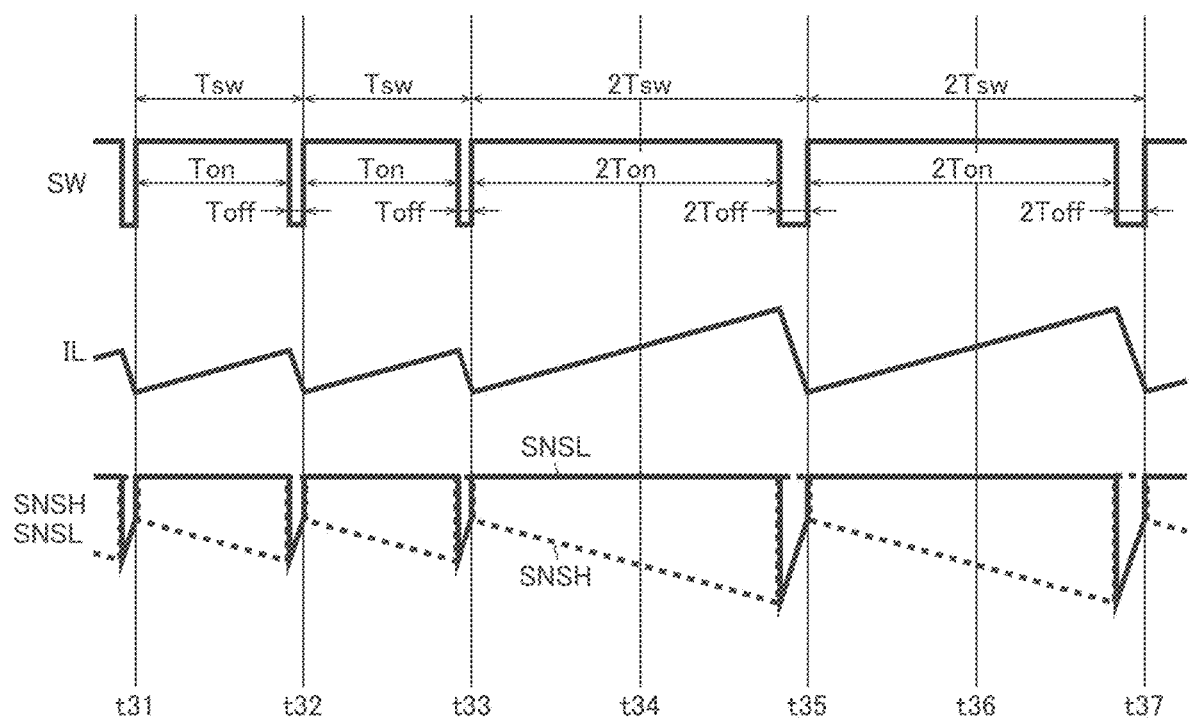
FIG. 11 is a diagram showing a function of extending an on-period.

FIG. 11 is a diagram showing the function of extending the on-period Ton, illustrating, from top down, the switching voltage SW, the inductor current IL, and the low-side sense signal SNSL (solid line) along with the high-side sense signal SNSH (broken line).

Between time points t31 and t33, the switching voltage SW is pulse-driven at the switching period Tsw. On the other hand, when the difference between the input voltage PVDD and the output voltage VOUT becomes so small that the on-duty D (=Ton/Tsw) is close to 100%, then, as shown between time points t33 and t37, the switching power supply 100 shifts into an extension mode in which it ignores the off-timing of the output transistor 111 to extend the on-timing Ton of the output transistor 111.

To describe specifically based on what is illustrated in FIG. 11, between time points t33 and t34, the off-period Toff which should ordinarily occur is skipped and, as a result, the apparent switching period is extended to 2Tsw (that is, between time points t33 and t35). Accordingly, the on-period of the output transistor 111 is extended to 2Ton. The same applies to between time points t35 and t37.

With this function of extending the on-period Ton, although the output voltage VOUT has somewhat larger ripples, it is possible to keep the output voltage VOUT continuous, which cannot be achieved with a configuration where the on-duty D shifts abruptly from a PWM-controlled state to a state fixed at 100% (that is, a state of through-output of the input voltage PVDD).

A shift to the extension mode can be determined by checking whether the feedback voltage FB (or the output voltage VOUT) is lower than a predetermined threshold voltage.

In the extension mode, however, as mentioned previously, the on-period Ton is very long. Thus, acquiring only the low-side current feedback information IinfoL during the off-period of the output transistor 111 may result in a significant deviation between the low-side sense signal SNSL held in the preceding off-period Toff and the low-side sense signal SNSL to be sampled in the subsequent off-period Toff, and this may lead to unstable sampling.

On the other hand, by acquiring not only the low-side current feedback information IinfoL during the off-period Toff but also the high-side current feedback information IinfoH during the on-period Ton, it is possible to let the differential error signals ERRP and ERRN during the on-period Ton follow the high-side inductor current ILH. Thus, it is also possible to let the differential error signals ERRP and ERRN during the off-period Toff follow the low-side inductor current ILL without delay. This achieves continuous current feedback control, which can easily be stabilized.

Open Feedback Terminal

Figure 12:
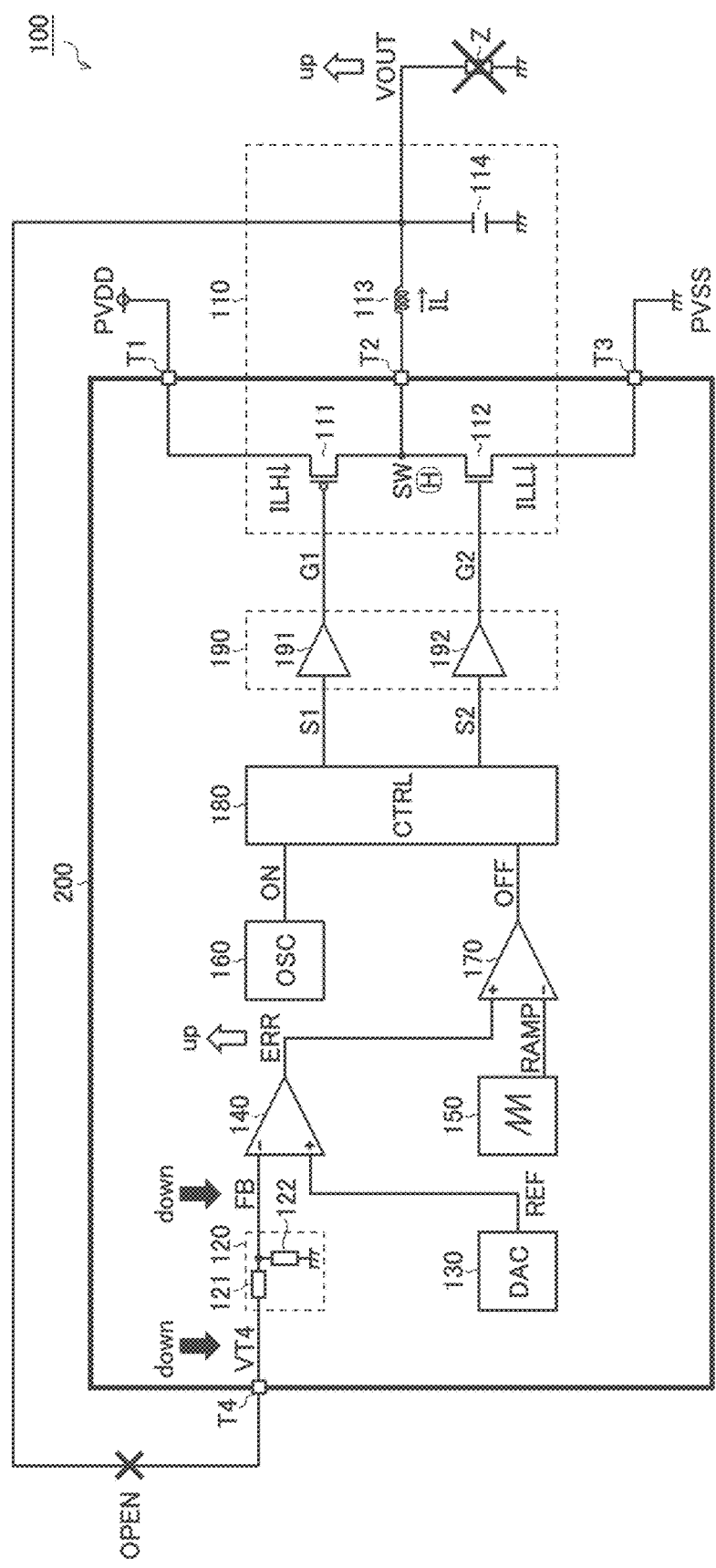
FIG. 12 is a diagram showing behavior observed when a feedback terminal becomes open.

FIG. 12 a diagram showing the behavior observed when the feedback terminal T4 becomes open. When the feedback path of the output voltage VOUT is cut off due to a fault or the like, the feedback terminal T4 for receiving feedback input of the output voltage VOUT becomes open.

In that case, the feedback voltage FB is pulled down to a grounded terminal via the resistor 122 and thus drops down to the GND level. Accordingly, the error signal ERR is fixed at high level, and this brings a state where no pulse occurs in the off signal OFF from the PWM comparator 170 and the output transistor 111 stays on (for example, SW is fixed equal to PVDD).

In this way, when the feedback terminal T4 becomes open, the switching power supply 100 (in particular, the output feedback controller), judging that the output voltage VOUT is apparently lower than the target value, sets the on-duty D of the switching power supply 100 at the maximum value (for example, such that D equals 1 or a comparable value) and keeps raising the output voltage VOUT. This, in the worst case, leads to the destruction of the load Z that is fed with the output voltage VOUT. The following description discusses a novel embodiment that can solve the problem.

Seventh Embodiment

Figure 13:
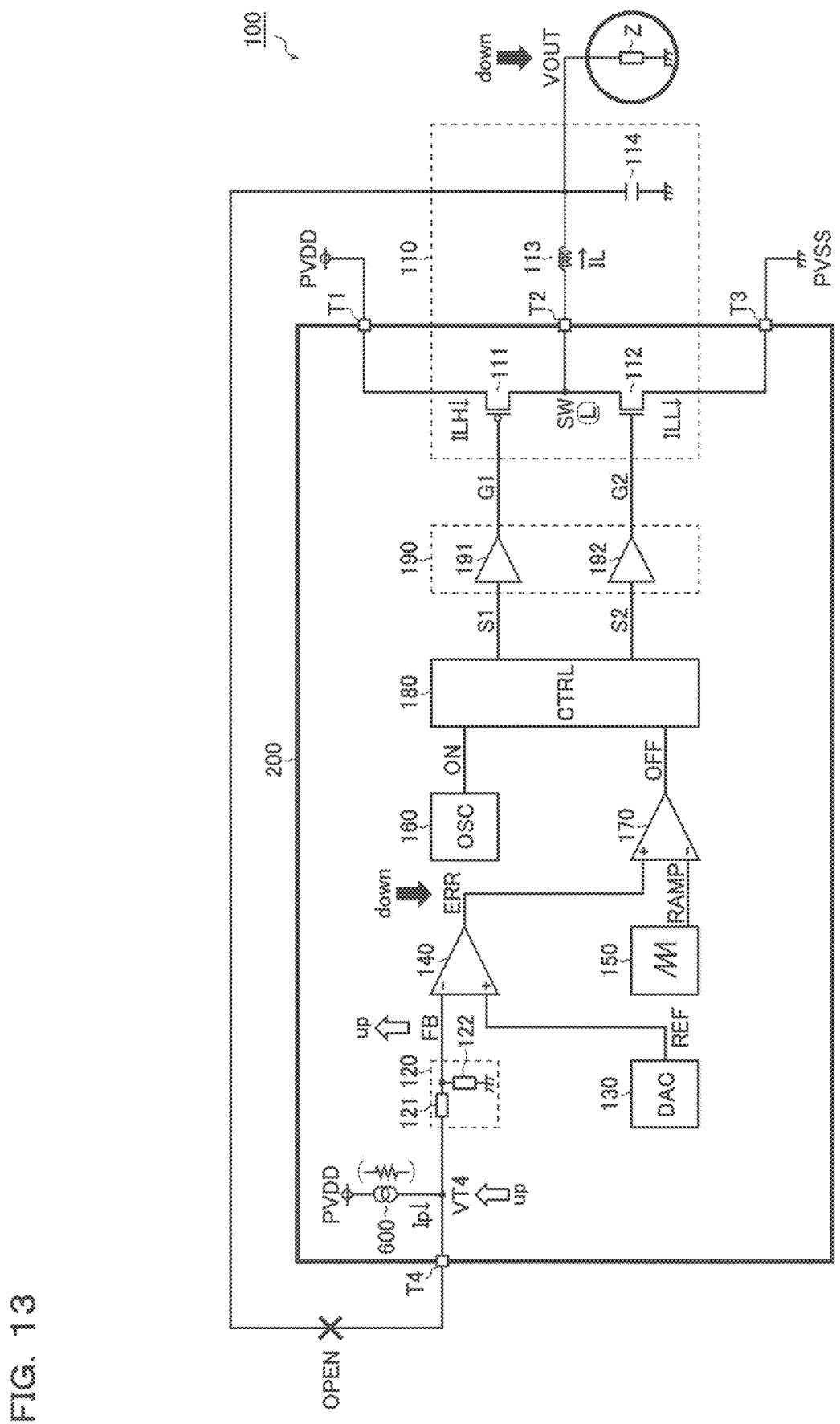
FIG. 13 is a diagram showing a switching power supply according to a seventh embodiment.

FIG. 13 is a diagram showing a switching power supply 100 according to a seventh embodiment. This embodiment, while being based on the basic configuration (FIG. 1) described previously, additionally includes an open protector 600.

The open protector 600 varies the terminal voltage VT4 at the feedback terminal T4 so as to lower the on-duty D of the switching power supply 100 when the feedback terminal T4 becomes open. Specifically, the open protector 600, when the feedback terminal T4 becomes open, raises the terminal voltage VT4 at the feedback terminal T4 to make the feedback voltage FB higher than the reference voltage REF.

For the open protector 600, as shown in FIG. 13, a current source or a resistor can be used which is connected between the application terminal for the input voltage PVDD and the feedback terminal T4 and which feeds a pull-up current Ip (of a minute value of about, for example, 100 nA) to the feedback terminal T4.

The operation of the open protector 600 will now be described. When the feedback terminal T4 becomes open, the pull-up current Ip passes from the open protector 600 into the feedback voltage generation circuit 120.

Here, setting in advance the current value of the pull-up current Ip multiplied by the resistance value of the resistor 122 (that is, the feedback voltage FB) to be higher than the reference voltage REF results in the error signal ERR being fixed at low level, and thus the off signal OFF from the PWM comparator 170 is fixed at low level; this brings a state where the output transistor 111 stays off (for example, SW is fixed equal to GND).

In this way, when the feedback terminal T4 becomes open, the open protector 600 so operates as to raise the feedback voltage FB to make it higher than the reference voltage REF. As a result, the switching power supply 100 (in particular, the output feedback controller), judging that the output voltage VOUT is apparently higher than the target value, sets the on-duty D of the switching power supply 100 at the minimum value (for example, such that D equals 0 or a comparable value) and thereby keeps lowering the output voltage VOUT. Thus, the output voltage VOUT can be safely shifted to a shut-down state (where VOUT equals 0 V or a comparable low voltage), and this helps prevent the destruction of the load Z.

On the other hand, when the feedback terminal T4 is not open, almost all the pull-up current Ip that is generated by the open protector 600 passes through a current path that has a lower impedance than the feedback voltage generation circuit 120 (specifically, the current path leading from the feedback terminal T4 to the capacitor 114). Thus, the current value of the pull-up current Ip passing into the feedback voltage generation circuit 120 multiplied by the resistance value of the resistor 122 (that is, the bias component of the feedback voltage FB resulting from the pull-up current Ip) is negligibly low compared with the reference voltage REF, and thus it does not affect the regular output feedback control.

Eighth Embodiment

Figure 14:
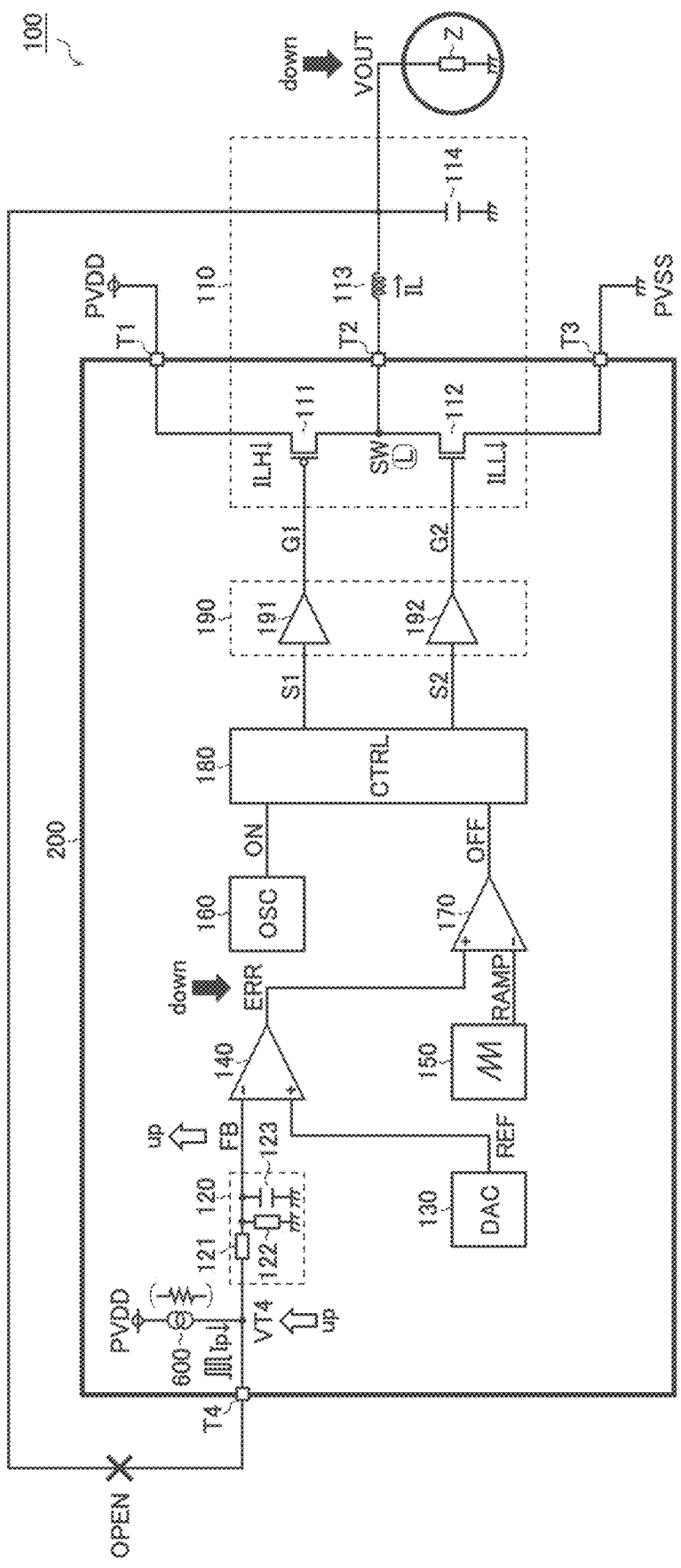
FIG. 14 is a diagram showing a switching power supply according to an eighth embodiment.

FIG. 14 is a diagram showing a switching power supply 100 according to an eighth embodiment. This embodiment, while being based on the seventh embodiment (FIG. 13) described previously, includes innovations in the configuration of the feedback voltage generation circuit 120 and in the operation of generating the pull-up current Ip.

More specifically, the feedback voltage generation circuit 120 includes, in addition to the resistors 121 and 122, a capacitor 123 that is connected in parallel with the resistor 122. With this configuration, it is possible to raise the feedback voltage FB with the pull-up current Ip more stably when the feedback terminal T4 becomes open.

With capacitor 123 provided, the open protector 600 can generate the pull-up current Ip intermittently. This configuration helps reduce the current consumed by the open protector 600 (in particular, the current that is wasted when the feedback terminal T4 is not open).

Ninth Embodiment

Figure 15:
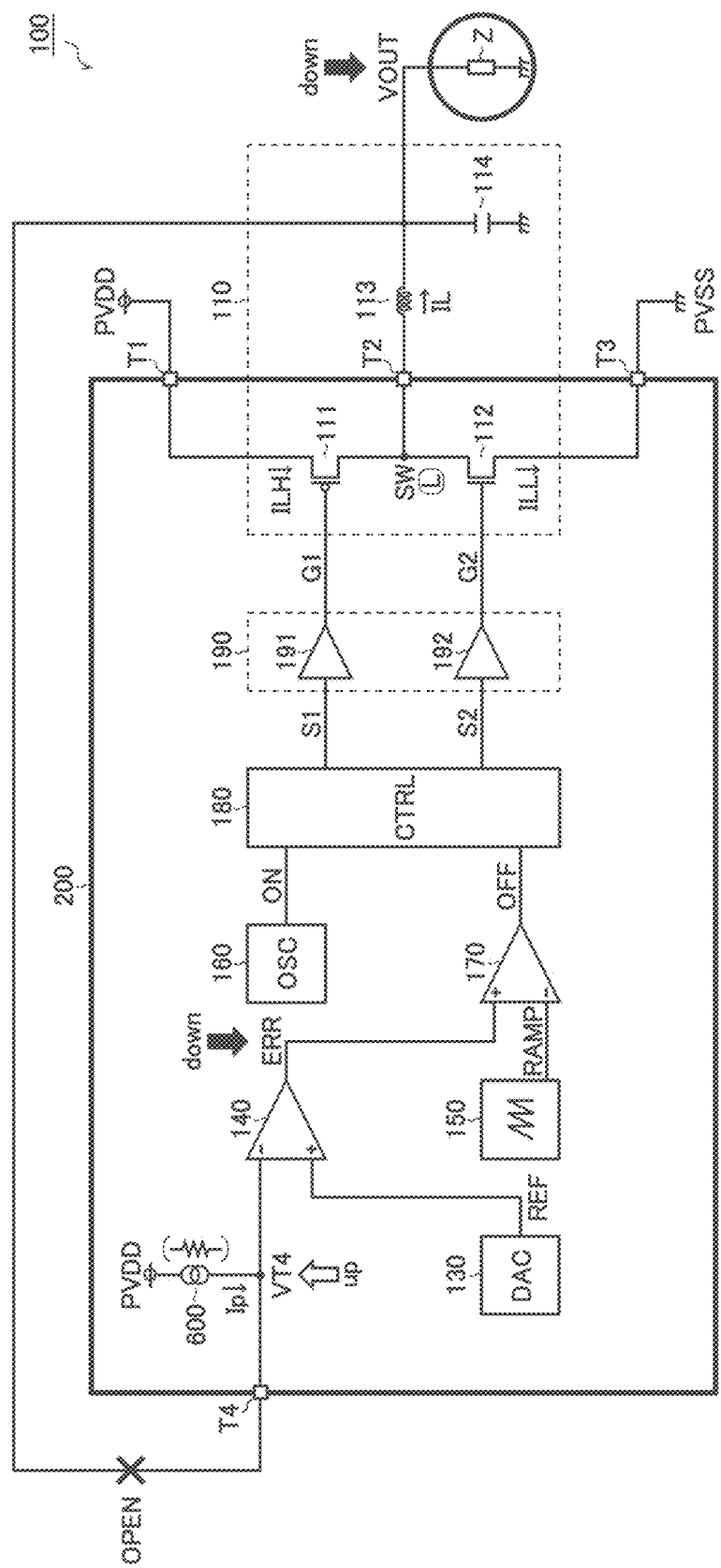
FIG. 15 is a diagram showing a switching power supply according to a ninth embodiment.

FIG. 15 is a diagram showing a switching power supply 100 according to a ninth embodiment. This embodiment, while being based on the seventh embodiment (FIG. 13) described previously, lacks the feedback voltage generation circuit 120 and instead the terminal voltage VT4 at the feedback terminal T4 (when the feedback terminal T4 is not open, VT4 equals VOUT) is directly fed to the error amplifier 140.

That is, in the switching power supply 100 (in particular, the output feedback controller), duty control for the switching power supply 100 is performed such that the terminal voltage VT4 at the feedback terminal remains equal to the predetermined reference voltage REF. Needless to say, also with this configuration, the open protector 600 is effective.

When the feedback terminal T4 becomes open, the open protector 600 so operates as to raise the terminal voltage VT4 at the feedback terminal T4 up to nearly the input voltage PVDD (>REF). As a result, the switching power supply 100 (in particular, the output feedback controller), judging that the output voltage VOUT is apparently higher than the target value, sets the on-duty D of the switching power supply 100 at the minimum value (for example, such that D equals 0 or a comparable value) and thereby keeps lowering the output voltage VOUT. Thus, the output voltage VOUT can be safely shifted to a shut-down state (where VOUT equals 0 V or a comparable low voltage), and this helps prevent the destruction of the load Z. This open protection operation is basically similar to that in the seventh embodiment (FIG. 13) and the eighth embodiment (FIG. 14) described previously.

With the switching power supply 100 of this embodiment, there is no need for the feedback voltage generation circuit 120, and this helps reduce the circuit scale. It is also possible to improve the accuracy of voltage feedback control.

Tenth Embodiment

Figure 16:
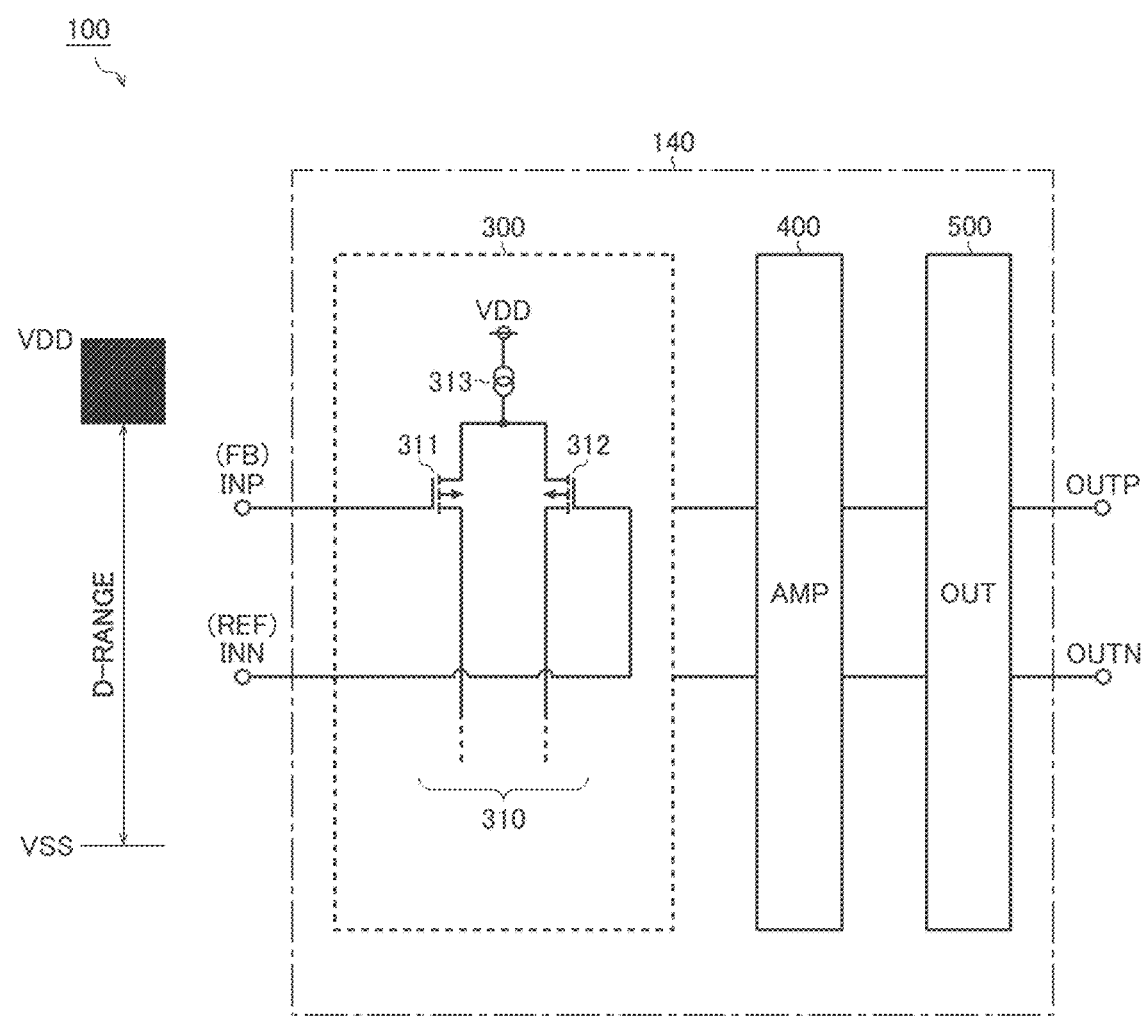
FIG. 16 is a diagram showing a switching power supply according to a tenth embodiment.

FIG. 16 is a diagram showing a switching power supply 100 according to a tenth embodiment (corresponding to a first comparative example to be compared with a twelfth embodiment (FIG. 19), which will be described later). In the switching power supply 100 of this embodiment, the error amplifier 140 includes a differential input circuit 300, an amplifying circuit 400, and a differential output circuit 500.

The differential input circuit 300 includes a differential input stage 310 that receives differential input signals INP and INN with a pair of P-channel transistors. The differential input stage 310 includes, as main circuit elements, PMOSFETs 311 and 312 and a current source 313.

The first terminal of the current source 313 is connected to a powered terminal (an application terminal for the supply voltage VDD). The second terminal of the current source 313 is connected to the respective sources of the PMOSFETs 311 and 312. The gate of the PMOSFET 311 is, as the first differential input terminal of the differential input circuit 300 (that is, the inverting input terminal (−) of the error amplifier 140), connected to an application terminal for the differential input signal INP (that is, the feedback voltage FB). The gate of the PMOSFET 312 is, as the second differential input terminal of the differential input circuit 300 (that is, the non-inverting input terminal (+) of the error amplifier 140), connected to an application terminal for the differential input signal INN (that is, the reference voltage REF).

The amplifying circuit 400 amplifies the output signals of the differential input circuit 300 and outputs the results.

Based on the output signals of the amplifying circuit 400, the differential output circuit 500 outputs differential output signals OUTP and OUTN. The differential output circuit 500 is not limited to one of a differential output type but may instead be of a single output type.

In this way, using the P-channel differential input stage 310 ensures trouble-free operation even when the ground voltage VSS (=0 V) is fed in as the differential input signals INP and INN. However, as the difference between the differential input signals INP/INN and the supply voltage VDD becomes smaller, operation may suffer trouble. Specifically, using the P-channel differential input stage 310 alone results in a limited input dynamic range on the power supply side.

Eleventh Embodiment

Figure 17:
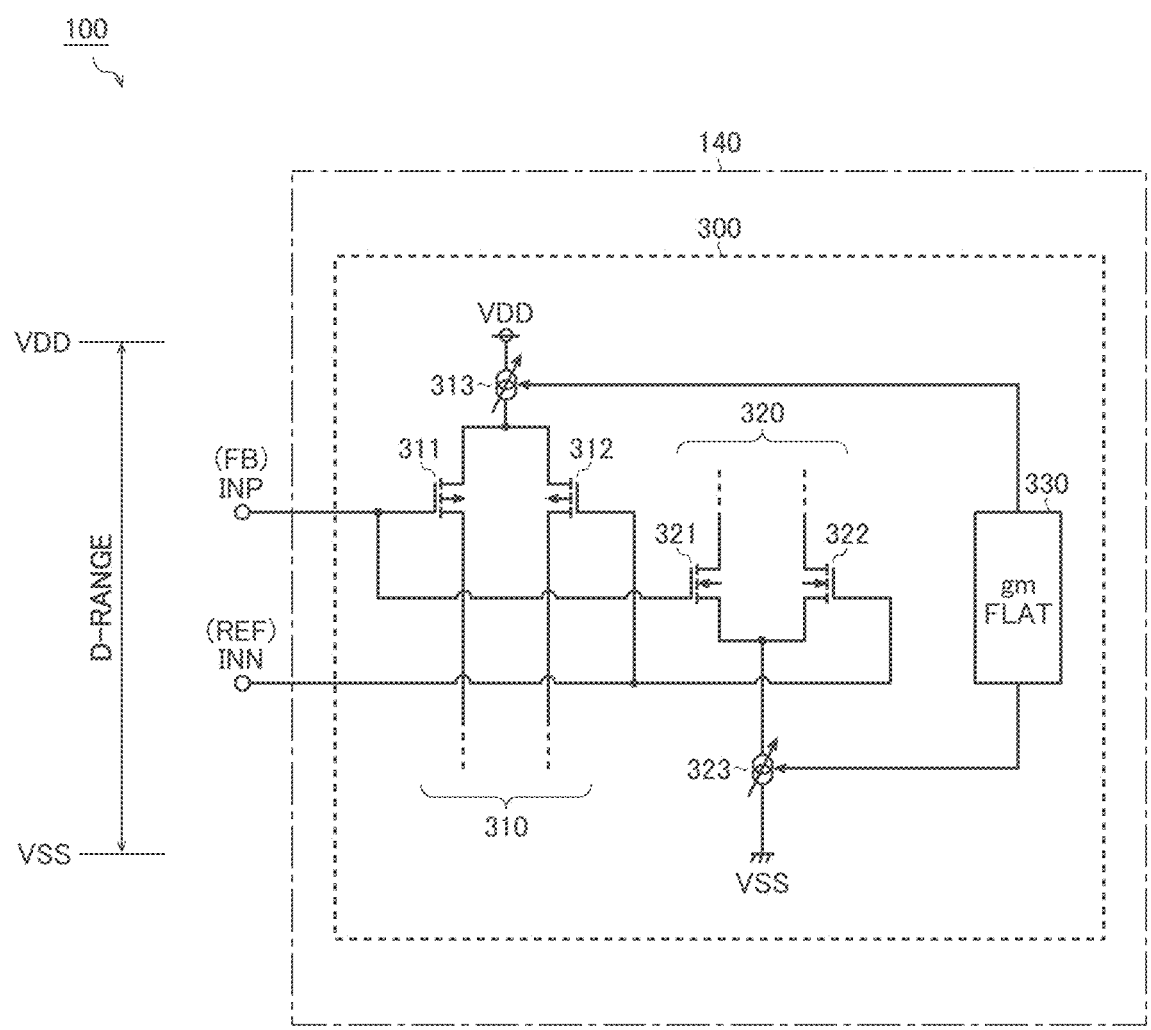
FIG. 17 is a diagram showing a switching power supply according to an eleventh embodiment.

FIG. 17 is a diagram showing a switching power supply 100 according to an eleventh embodiment (corresponding to a second comparative example to be compared with the twelfth embodiment (FIG. 19), which will be described later). This embodiment, while being based on the tenth embodiment (FIG. 16) described previously, includes a modified differential input circuit 300. Accordingly, FIG. 17 omits illustration of the amplifying circuit 400 and the output circuit 500, and the following description focuses on the differential input circuit 300.

The differential input circuit 300 in this embodiment includes, in addition to the differential input stage 310 described previously, a differential input stage 320 and a gm flattener 330.

The differential input stage 320 is a circuit block which receives the differential input signals INP and INN with a pair of N-channel transistors. The differential input stage 320 includes, as main circuit elements, NMOSFETs 321 and 322 and a current source 323.

The first terminal of the current source 323 is connected to a grounded terminal (that is, an application terminal for the ground voltage VSS). The first terminal of the current source 323 is connected to the respective sources of the NMOSFETs 321 and 322. The gate of the NMOSFET 321 is, as the first differential input terminal of the differential input circuit 300 (that is, the inverting input terminal (−) of the error amplifier 140), connected to an application terminal for the differential input signal INP (that is, the feedback voltage FB). The gate of the NMOSFET 322 is, as the second differential input terminal of the differential input circuit 300 (that is, the non-inverting input terminal (+) of the error amplifier 140), connected to an application terminal for the differential input signal INN (that is, the reference voltage REF).

As mentioned previously, using the P-channel differential input stage 310 alone results in a limited input dynamic range on the power supply side. On the other hand, for the sake of discussion, using the N-channel differential input stage 320 alone results in a limited input dynamic range on the ground side.

By contrast, with a configuration using the P-channel differential input stage 310 and the N-channel differential input stage 320 in parallel (what is called a rail-to-rail configuration), the input dynamic ranges on the opposite sides complement each other, and this permits full-range operation from the ground voltage VSS to the supply voltage VDD. Thus, for example, by raising the reference voltage REF, it is possible to enhance the accuracy of output feedback control.

The gm flattener 330 adjusts the amounts of current from the current sources 313 and 323 respectively such that the transconductance gm of the error amplifier 140 does not vary within the input dynamic range of the differential input circuit 300.

Figure 18:
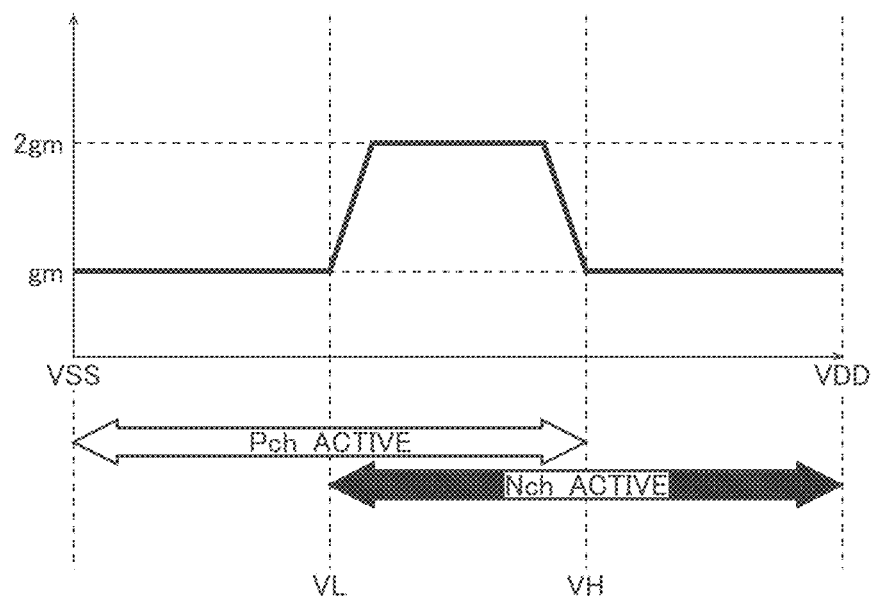
FIG. 18 is a diagram showing a correlation of INP and INN versus gm in the eleventh embodiment.

FIG. 18 is a diagram showing the correlation of the differential input signals INP and INN (along the horizontal axis) versus the transconductance gm (along the vertical axis) in the eleventh embodiment.

As shown in FIG. 18, when the input dynamic range of the P-channel differential input stage 310 is from VSS to VH and the input dynamic range of the N-channel differential input stage 320 is from VL to VDD, then the common active region of those two stages is from VL to VH (where VSS<VL<VH<VDD).

In the just-mentioned common active region, the differential input stages 310 and 320 are both operative, making the transconductance gm twice as high. This makes the topological designing of the switching power supply 100 difficult and tends to lead to an unstable output feedback loop.

To avoid that, when a rail-to-rail configuration is adopted, it is generally necessary to use a gm flattener 330 to keep the transconductance gm flat. A downside is that the gm flattener 330 has a complicate circuit design. The following description proposes a novel embodiment that does not require a gm flattener 330.

Twelfth Embodiment

Figure 19:
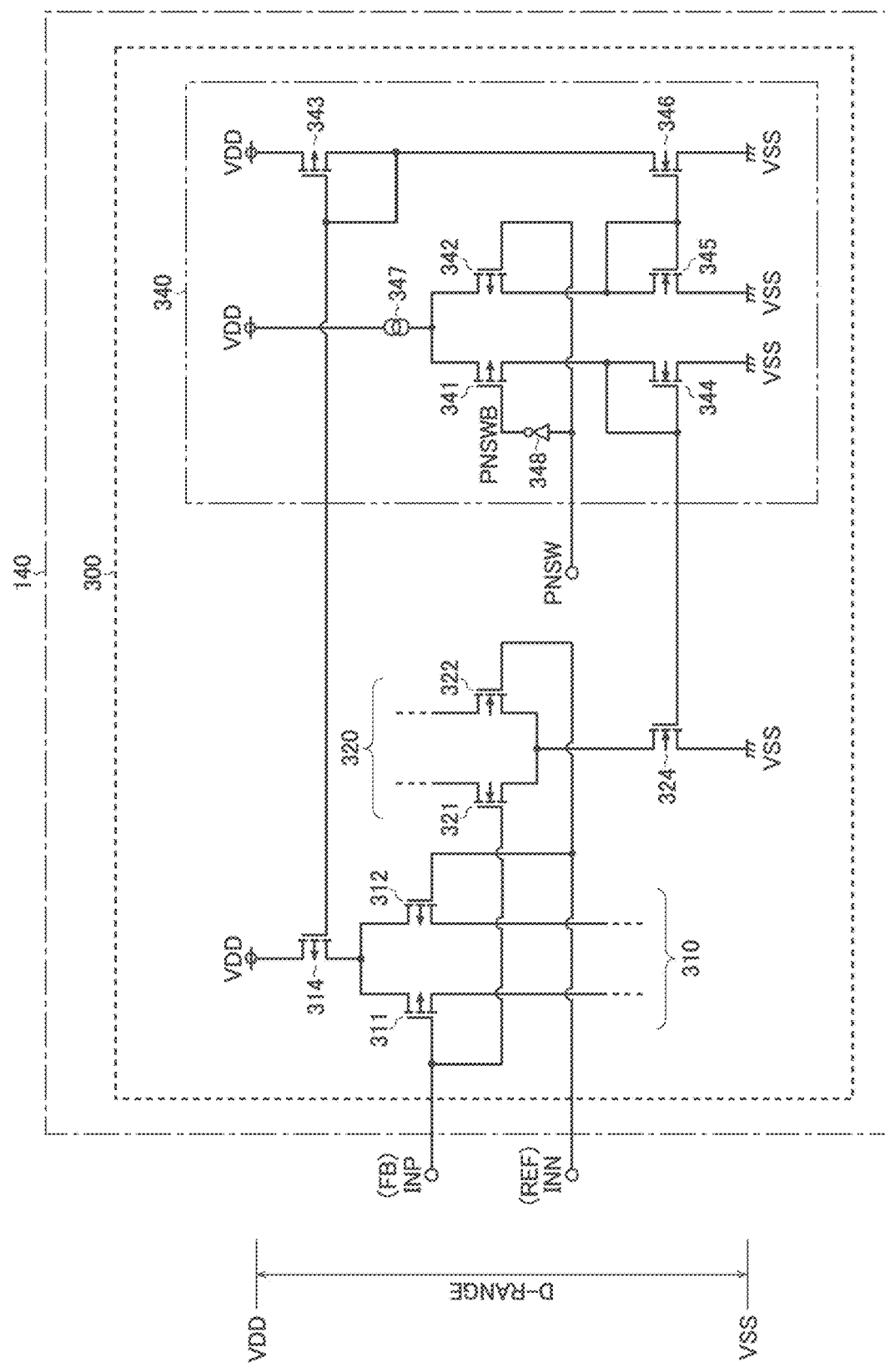
FIG. 19 is a diagram showing a switching power supply according to a twelfth embodiment.

FIG. 19 is a diagram showing a switching power supply 100 according to a twelfth embodiment. This embodiment, while being based on the eleventh embodiment (FIG. 17) described previously, includes a further improved differential input circuit 300. Accordingly, FIG. 19 too omits illustration of the amplifying circuit 400 and the differential output circuit 500, and the following description focuses on the differential input circuit 300.

The differential input circuit 300 in this embodiment includes, instead of the gm flattener 340, an input stage switcher 340. To accommodate the modification, the current source 313 in the differential input stage 310 is replaced with a PMOSFET 314, and the current source 323 in the differential input stage 320 is replaced with an NMOSFET 324.

The input stage switcher 340 includes PMOSFETs 341 to 343, NMOSFETs 344 to 346, a current source 347, and an inverter 348. The input stage switcher 340 feeds a driving current to one of differential input stages 310 and 320 in accordance with an input stage switch signal PNSW, and thereby selectively makes one of the differential input stages 310 and 320 operate.

The first terminal of the current source 347 is connected to a powered terminal. The second terminal of the current source 347 is connected to the respective sources of the PMOSFETs 341 and 342. The drain of the NMOSFET 321 is connected to the drain of the NMOSFET 344. The drain of the PMOSFET 342 is connected to the drain of the NMOSFET 345. The gate of the PMOSFET 341 is connected to the output terminal of the inverter 348 (that is, an application terminal for an inverted input stage switch signal PNSWB). The gate of the PMOSFET 342 and the input terminal of the inverter 348 are both connected to an application terminal for the input stage switch signal PNSW.

The respective sources of the NMOSFETs 344 to 346 are connected to the grounded terminal. The gates of the NMOSFETs 324 and 344 are both connected to the drain of the NMOSFET 344. The respective gates of the NMOSFETs 345 and 346 are both connected to the drain of the NMOSFET 345. The drain of the NMOSFET 346 is connected to the drain of the PMOSFET 343. The source of the PMOSFET 343 is connected to the powered terminal. The respective gates of the PMOSFETs 314 and 343 are both connected to the drain of the PMOSFET 343.

Of the circuit elements mentioned above, the PMOSFETs 341 and 342 correspond to a differential pair that receives the input stage switch signal PNSW and its logically inverted signal (that is, the inverted input stage switch signal PNSWB).

The pair of NMOSFETs 324 and 344, the pair of NMOSFETs 345 and 346, and the pair of NMOSFETs 314 and 343 each form a current mirror, feeding the two-channel currents that are output from the above-mentioned differential pair (PMOSFETs 341 and 342) to the differential input stages 310 and 320 as the driving currents for these.

When PNSW=L (PNSWB=H), the PMOSFET 341 is off and the PMOSFET 342 is on. Accordingly, no current passes through the NMOSFET 344, and thus no current passes through the NMOSFET 324 paired with it. Consequently, no driving currents are fed to the N-channel differential input stage 320, which thus remains inoperative. On the other hand, a current passes through the NMOSFET 345, and thus a current passes through the NMOSFET 346 paired with it. As a result, a current passes through the PMOSFET 343, and thus a current passes through the PMOSFET 314 paired with it. Consequently, driving currents are fed to the P-channel differential input stage 310, which thus remains operative.

In contrast, when PNSW=H (PNSWB=L), the PMOSFET 341 is on and the PMOSFET 342 is off. Accordingly, a current passes through the NMOSFET 344, and thus a current passes through the NMOSFET 324 paired with it. Consequently, driving currents are fed to the N-channel differential input stage 320, which thus remains operative. On the other hand, no current passes through the NMOSFET 345, and thus no current passes through the NMOSFET 346 paired with it. As a result, no current passes through the PMOSFET 343, and thus no current passes through the PMOSFET 314 paired with it. Consequently, no driving currents are fed to the P-channel differential input stage 310, which thus remains inoperative.

Figure 20:
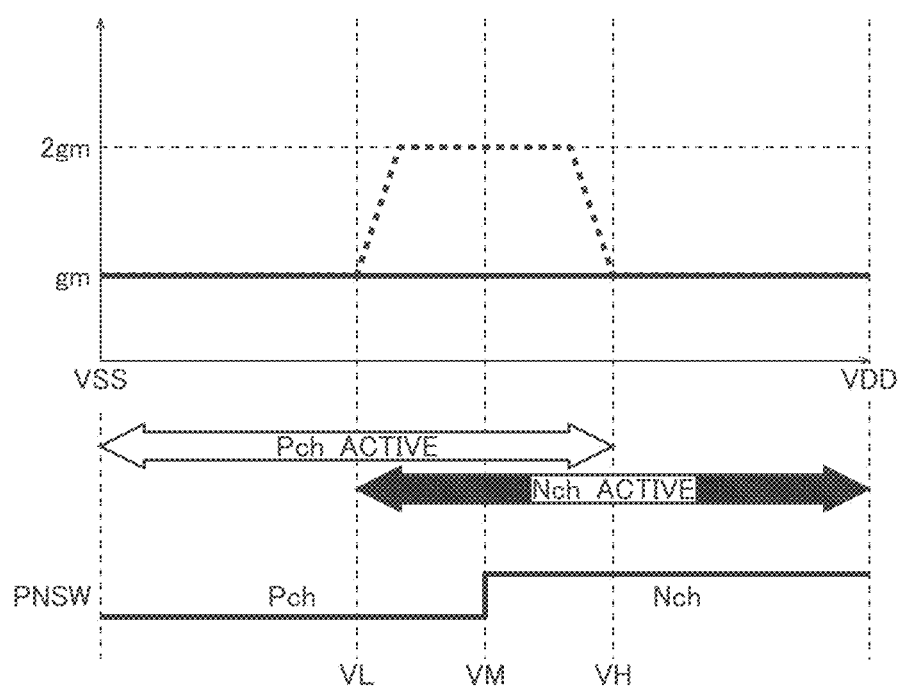
FIG. 20 is a diagram showing a correlation of INP and INN versus gm in the twelfth embodiment.

FIG. 20 is a diagram showing the correlation of the differential input signals INP and INN (along the horizontal axis) versus the transconductance gm (along the vertical axis) in the twelfth embodiment.

As shown in FIG. 20, when the differential input signals INP and INN are lower than a predetermined threshold level VM that is set in the common active region (from VL to VH) of the differential input stages 310 and 320 (where VL<VM<VH), the input stage switch signal PNSW is kept at low level. Accordingly, the input stage switcher 340 controls the driving currents so as to keep the differential input stage 310 operative and the differential input stage 320 inoperative.

In contrast, when the differential input signals INP and INN are higher than the threshold level VM, the input stage switch signal PNSW is kept at high level. Accordingly, the input stage switcher 340 controls the driving currents so as to keep the differential input stage 320 operative and the differential input stage 310 inoperative.

As described above, with the differential input circuit 300 according to this embodiment, by logically switching, in a narrow dead range, the driving currents supplied respectively to the P-channel differential input stage 310 and the N-channel differential input stage 320, it is possible to flatten the transconductance gm without using the input stage switcher 340, which has a complicate circuit configuration, and thereby to widen the input dynamic range of the error amplifier 140. The above-mentioned control of the driving currents can be achieved by use of a differential pair with a raised gain or through logical switching.

Widening the input dynamic range of the error amplifier 140 makes it possible for the error amplifier 140 to receive the output voltage VOUT (for example, OUT=1.2 V) as it is, without it being subjected to voltage division. This eliminates the need for the feedback voltage generation circuit 120, and thus contributes to a reduced circuit scale. It is also possible to enhance the accuracy of voltage feedback control.

Thirteenth Embodiment

Figure 21:
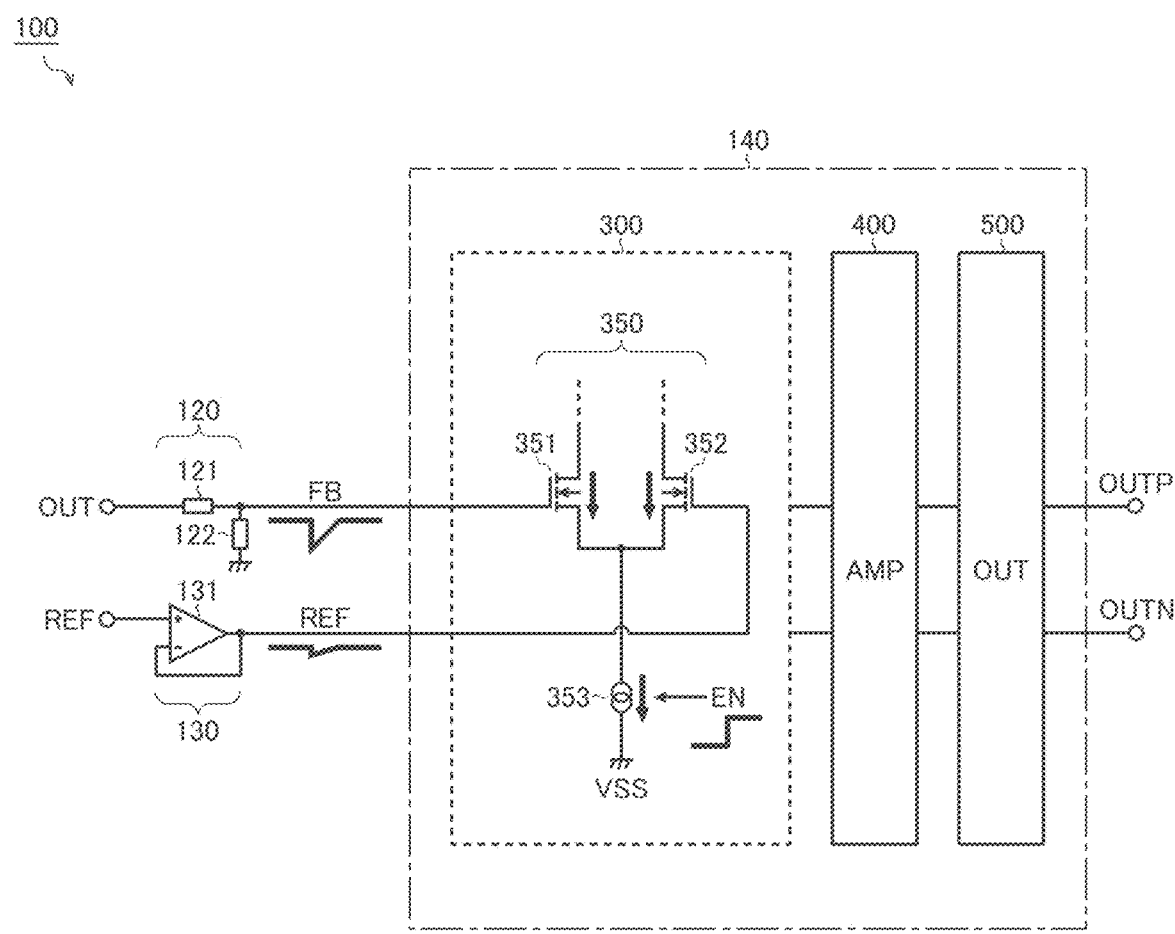
FIG. 21 is a diagram showing a switching power supply according to a thirteenth embodiment.

FIG. 21 is a diagram showing a switching power supply 100 according to a thirteenth embodiment (corresponding to a third comparative example to be compared with a fourteenth embodiment (FIGS. 22 and 23), which will be described later). In the switching power supply 100 of this embodiment, the error amplifier 140 includes a differential input circuit 300, an amplifying circuit 400, and a differential output circuit 500.

The differential input circuit 300 includes a differential input stage 350 that receives the feedback voltage FB and the reference voltage REF with a pair of N-channel transistors. The differential input stage 350 includes, as main circuit elements, NMOSFET 351 and 352 and a current source 353.

The first terminal of the current source 353 is connected to a grounded terminal (that is, an application terminal for the ground voltage VSS). The second terminal of the current source 353 is connected to the respective sources of the NMOSFET 351 and 352. The gate of the NMOSFET 351 is, as the first differential input terminal of the differential input circuit 300 (that is, the inverting input terminal (−) of the error amplifier 140), connected to an application terminal for the differential input signal INP (that is, the feedback voltage FB). The gate of the NMOSFET 352 is, as the second differential input terminal of the differential input circuit 300 (that is, the non-inverting input terminal (+) of the error amplifier 140), connected to an application terminal for the differential input signal INN (that is, the reference voltage REF).

The amplifying circuit 400 amplifies the output signals of the differential input circuit 300 and outputs the results.

Based on the output signals of the amplifying circuit 400, the differential output circuit 500 outputs differential output signals OUTP and OUTN. The differential output circuit 500 is not limited to one of a differential output type but may instead be one of a single output type.

The switching power supply 100 is provided with a function (what is called a sleep function) of, for example in a light-load condition, suspending switching operation to stop a circuit with high current consumption. For example, in the error amplifier 140, the driving current for the differential input stage 350 is turned on and off in accordance with an enable signal EN. More specifically, when the enable signal EN is turned to a first logic level (that is, the logic level indicating the sleep mode), the current source 353 is turned off. On the other hand, when the enable signal EN is turned to a second logic level (that is, the logic level indicating the normal mode), the current source 353 is turned on A shift to the sleep mode can be determined by checking whether the feedback voltage FB (or the output voltage VOUT) is higher than a predetermined threshold voltage (e.g., REF×1.03). Likewise, a return to the normal mode can be determined by checking whether the feedback voltage FB is lower than a predetermined threshold voltage (e.g., REF× 1.01).

The switching power supply 100 provided with the sleep function described above can achieve low current consumption. Inconveniently, however, on return to the normal mode under the condition REF FB (that is, when the differential input circuit 300 is restarted), as the driving current generated by the current source 353 rises, a transient kickback current passes through the respective gates of the NMOSFET 351 and 352.

Here, the gate of the NMOSFET 351 is connected to the feedback voltage generation circuit 120 (corresponding to a first signal source). The feedback voltage generation circuit 120 is a resistor ladder composed of resistors 121 and 122, and accordingly has a comparatively high impedance.

On the other hand, the gate of the NMOSFET 352 is connected to the reference voltage generation circuit 130 (corresponding to a second signal source). The reference voltage generation circuit 130 has, as an output stage, a buffer 131, and accordingly has a lower impedance than the feedback voltage generation circuit 120.

Thus, when a kickback current flows when the differential input circuit 300 restarts, the gate voltage of the NMOSFET 351 (that is, the feedback voltage FB) exhibits a fluctuation (that is, kickback noise) that cannot be ignored from the system's perspective, causing the operation start point of the error amplifier 140 to deviate from where it is supposed to be. The following description discusses novel embodiments that can solve the problem.

Fourteenth Embodiment

Figure 22:
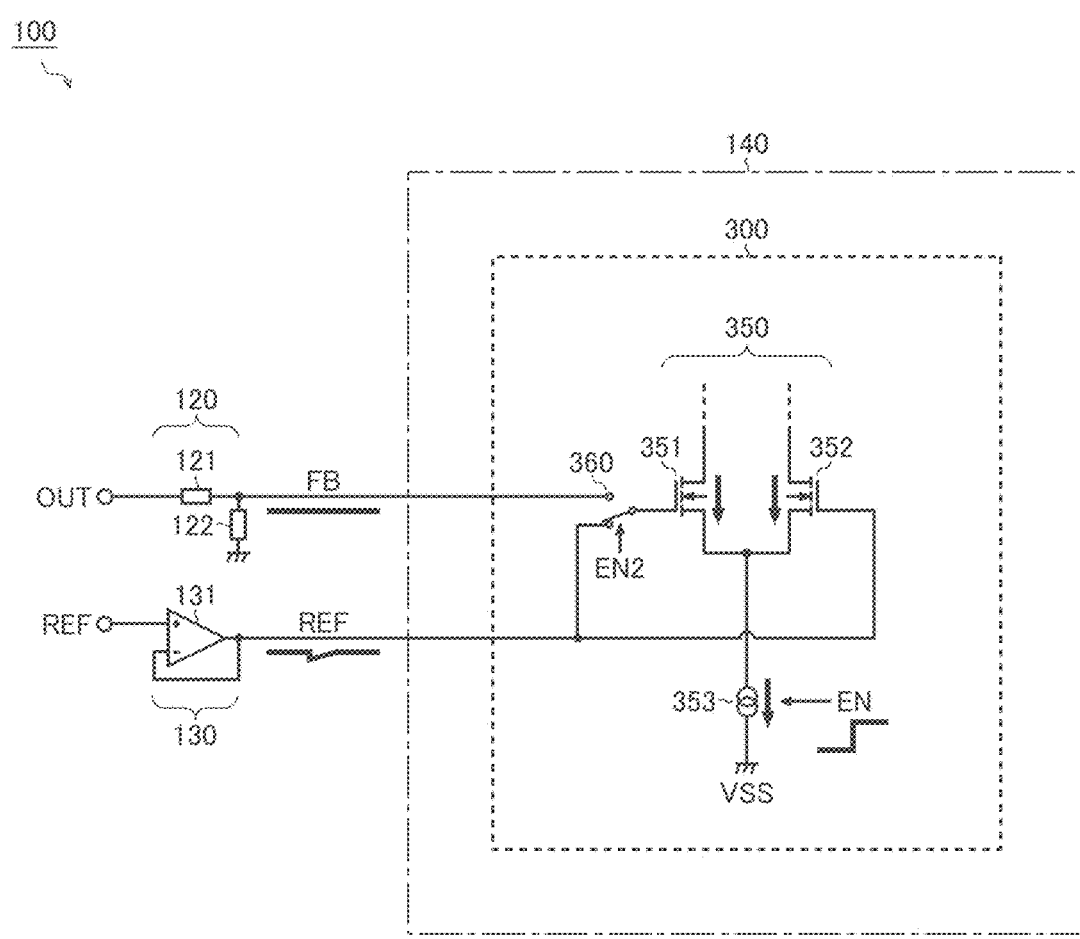
FIG. 22 is a diagram showing a switching power supply according to a fourteen embodiment (a first switched state)
Figure 23:
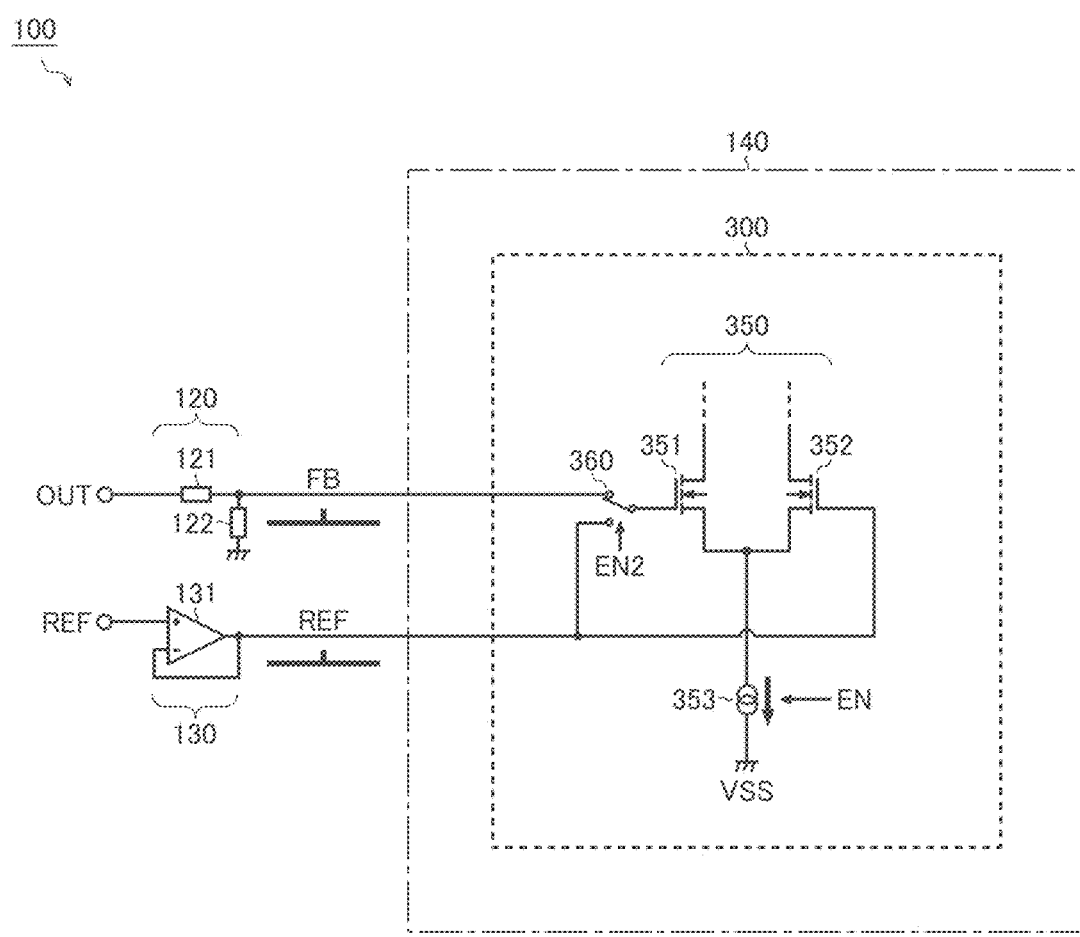
FIG. 23 is a diagram showing a switching power supply according to the fourteen embodiment (a second switched state)

FIGS. 22 and 23 are diagrams showing a switching power supply 100 according to a fourteenth embodiment. This embodiment, while being based on the thirteenth embodiment (FIG. 21) described previously, includes an improved differential input circuit 300. Accordingly, FIGS. 22 and 23 omit illustration of the amplifying circuit 400 and the output circuit 500, and the following description focuses on the differential input circuit 300.

The differential input circuit 300 in this embodiment includes, in addition to the differential input stage 350 described previously, a signal path switcher 360.

The common terminal of the signal path switcher 360 is connected to the gate of the NMOSFET 351. The first selection terminal of the signal path switcher 360 is connected to the feedback voltage generation circuit 120. The second selection terminal of the signal path switcher 360 is connected to the gate of the MOSFET 352 (or to the reference voltage generation circuit 130 connected to it). The control terminal of the signal path switcher 360 is connected to an application terminal for an enable signal EN2.

During the start-up of the differential input stage 350 (that is, immediately after the driving current for the differential input stage 350 starts passing), as shown in FIG. 22, the signal path switcher 360 is in a first switched state in which it keeps the gate of the NMOSFET 351 disconnected from the feedback voltage generation circuit 120 and short-circuited to the gate of the NMOSFET 352.

Through path switching control as described above, when the 300 is restarted, even if a transient kickback current passes through the respective gates of the NMOSFET 351 and 352, the feedback voltage FB does not exhibit any fluctuation whatever. As for the reference voltage REF, the reference voltage generation circuit 130 (in particular, the buffer 131), which has a comparatively low impedance, absorbs the fluctuation due to a kickback current, and thus no noteworthy problems result.

On the other hand, after the start-up of the differential input stage 350 (that is, after the driving current for the differential input stage 350 has stabilized), as shown in FIG. 23, the signal path switcher 360 shifts into a second switched state in which it keeps the gate of the NMOSFET 351 disconnected from the gate of the NMOSFET 352 and connected to the feedback voltage generation circuit 120.

Through path switching control as described above, it is possible to restart the regular operation of the error amplifier 140 without being affected by a transient kickback current. Incidentally, during the transition from the first switched state (FIG. 22) to the second switched state (FIG. 23), switching noise occurs in both the feedback voltage FB and the reference voltage REF. However, the switching noise is far fainter than kickback noise and can easily be coped with.

As described above, introducing the signal path switcher 360 helps suppress a fluctuation in the feedback voltage FB on return to the normal mode, and thus helps achieve a smooth return from the sleep mode to the normal mode.

Figure 24:
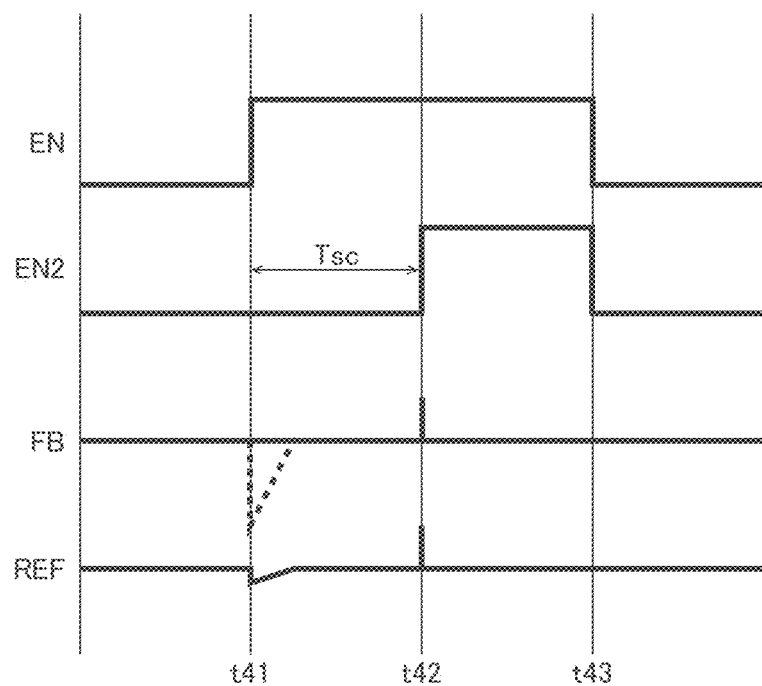
FIG. 24 is a diagram showing operation for preventing kickback noise.

FIG. 24 is a diagram specifically showing the operation for preventing kickback noise thus far described, illustrating, from top down, the enable signals EN and EN2, the feedback voltage FB, and the reference voltage REF.

Before time point t41, the enable signal EN is at low level (that is, the logic level indicating the sleep mode). Accordingly, the driving current through the current source 353 is off, and the differential input stage 350 (and hence the error amplifier 140) remains inoperative.

During that period, the enable signal EN2 is at low level (the logic level demanding the first switched state). Accordingly, the signal path switcher 360 is in the first switched state (FIG. 22) in which it keeps the gate of the NMOSFET 351 disconnected from the feedback voltage generation circuit 120 and connected to the gate of the NMOSFET 352.

When, at time point t41, the enable signal EN is raised to high level (that is, the logic level indicating the normal mode), the driving current through the current source 353 is turned on and the differential input stage 350 (and hence the error amplifier 140) restart its operation.

At this time, however, the enable signal EN2 remains at low level. Thus, the signal path switcher 360 is held in the first switched state (FIG. 22), and thus no kickback noise occurs in the feedback voltage FB.

Thereafter, at the lapse of a predetermined short-circuit time Tsc after time point 41, at time point t42, the enable signal EN is raised to high level (the logic level demanding the second switched state). Accordingly, the signal path switcher 360 is now in the second switched state (FIG. 23) in which it keeps the gate of the NMOSFET 351 disconnected from the gate of the NMOSFET 352 and connected to the feedback voltage generation circuit 120.

Thus, after the start-up of the differential input stage 350, until the short-circuit time Tsc elapses, the signal path switcher 360 keeps the gate of the NMOSFET 351 disconnected from the feedback voltage generation circuit 120 and short-circuited to the gate of the NMOSFET 352; after the short-circuit time Tsc elapses, the signal path switcher 360 keeps the gate of the NMOSFET 351 disconnected from the gate of the NMOSFET 352 and connected to the feedback voltage generation circuit 120.

Through path switching control as described above, it is possible to restart the regular operation of the error amplifier 140 without being affected by a transient kickback current. Incidentally, at time point t42, faint switching noise occurs in both the feedback voltage FB and the reference voltage REF but, as mentioned previously, it can easily be comped with.

The short-circuit time Tsc mentioned above can be set to be longer than the kickback duration at the start-up of the differential input stage 350 (that is, the time after kickback noise starts occurring until it subsides).

Thereafter, when, at time point t43, the enable signal EN falls to low level, the driving current through the current source 353 is turned off and the differential input stage 350 (and hence the error amplifier 140) stops operating. At this time, also the enable signal EN2 is lowered to low level. Thus, the signal path switcher 360 switches to the first switched state (FIG. 22).

As described above, the signal path switcher 360 can, when the differential input stage 250 is inoperative, keep the gate of the NMOSFET 351 disconnected from the feedback voltage generation circuit 120 and connected to the gate of the NMOSFET 352 beforehand.

The signal path switcher 360 introduced in this embodiment can be applied not only to an error amplifier 140 but to any other amplifiers or comparators.

Fifteenth Embodiment

Figure 25:
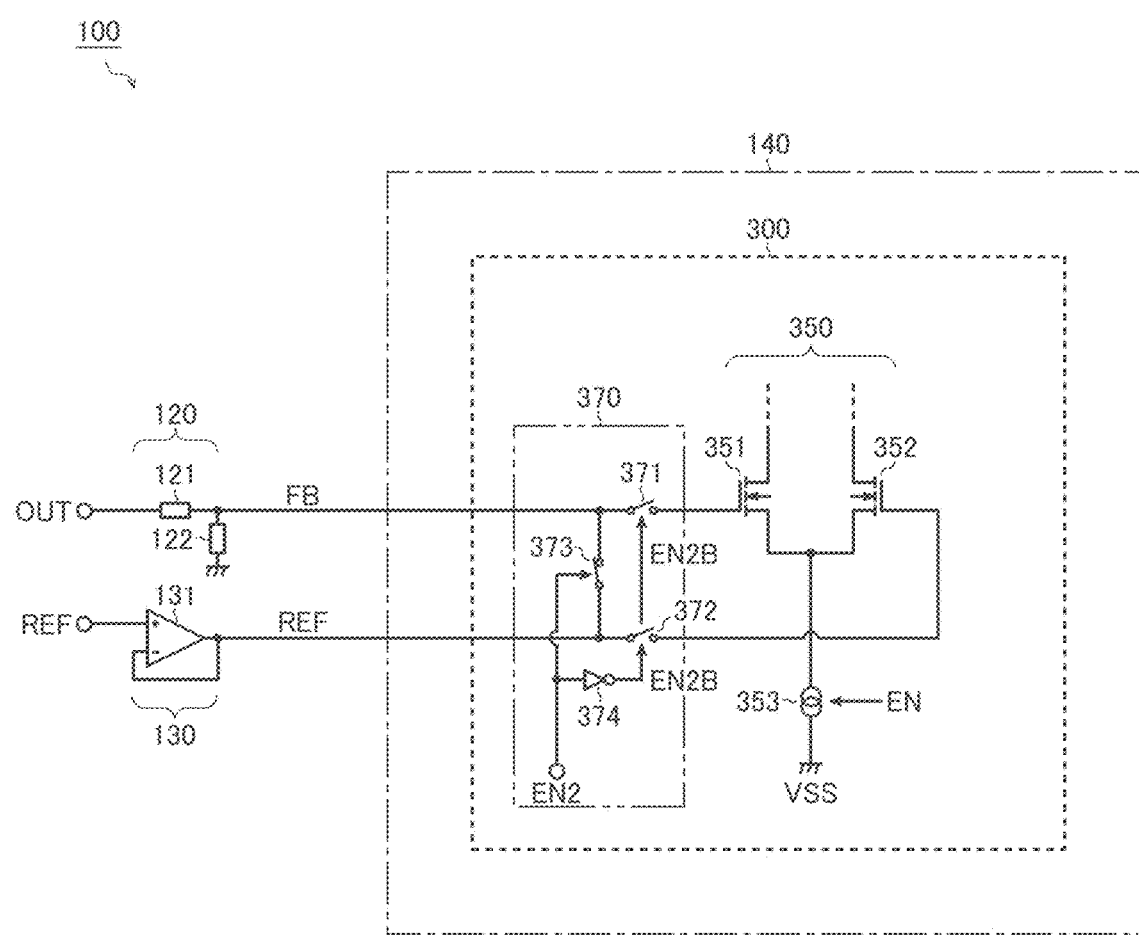
FIG. 25 is a diagram showing a switching power supply according to a fifteenth embodiment.

FIG. 25 is a diagram showing a switching power supply 100 according to a fifteenth embodiment. This embodiment, while being based on the fifteenth embodiment (FIGS. 22 and 23) described previously, includes as one modified example of the signal path switcher 360 a signal path switcher 370. Accordingly, FIG. 25 too omits illustration of the amplifying circuit 400 and the output circuit 500, and the following description focuses on the differential input circuit 300.

The signal path switcher 370 includes switches 371 to 373 and an inverter 374. The respective first terminals of the switches 371 to 373 are connected to the feedback voltage generation circuit 120. The second terminal of the switch 371 is connected to the gate of the NMOSFET 351. The first terminal of the switch 372 and the second terminal of the switch 373 are connected to a reference voltage generation circuit 130. The second terminal of the switch 372 is connected to the gate of the NMOSFET 352. The respective control terminals of the switches 371 and 372 are connected to the output terminal of the inverter 374 (that is, an application terminal for an inverted enable signal NE2B). The control terminal of the switch 373 and the input terminal of the inverter 374 are connected to an application terminal for the enable signal EN2.

For example, when the enable signal EN2 is at low level, the switches 371 and 372 are off and the switch 373 is on. That is, the gates of the NMOSFET 351 and 352 are short-circuited together and in addition the outputs of the feedback voltage generation circuit 120 and the reference voltage generation circuit 130 are short-circuited together.

On the other hand, when the enable signal EN2 is at high level, the switches 371 and 372 are on and the switch 373 is off. That is, the gates of the NMOSFET 351 and 352 are connected respectively to the feedback voltage generation circuit 120 and the reference voltage generation circuit 130, and the outputs of the voltage generation circuit 120 and the reference voltage generation circuit 130 cease to be short-circuited together.

Introducing the signal path switcher 370 according to this embodiment makes it possible, as in the fourteenth embodiment (FIGS. 22 and 23) described previously, to restart the regular operation of the error amplifier 140 without being effected by a transient kickback current.

Combinations of Different Embodiments

The various embodiments described above can be implemented in any combination unless inconsistent.

Applications

Figure 26:
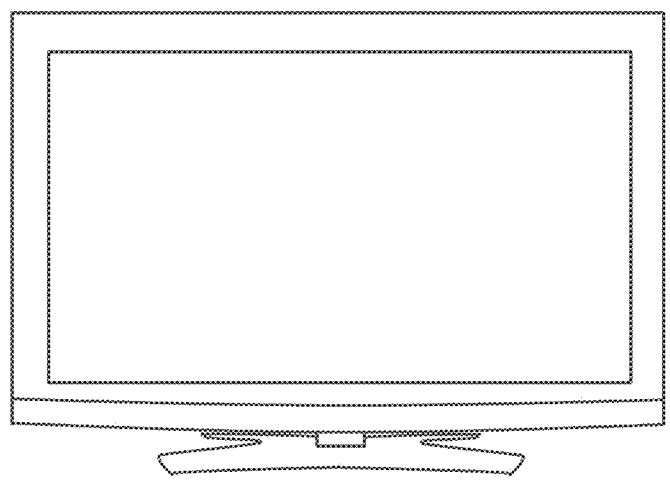
FIG. 26 is an exterior view of a television receiver.
Figure 27:
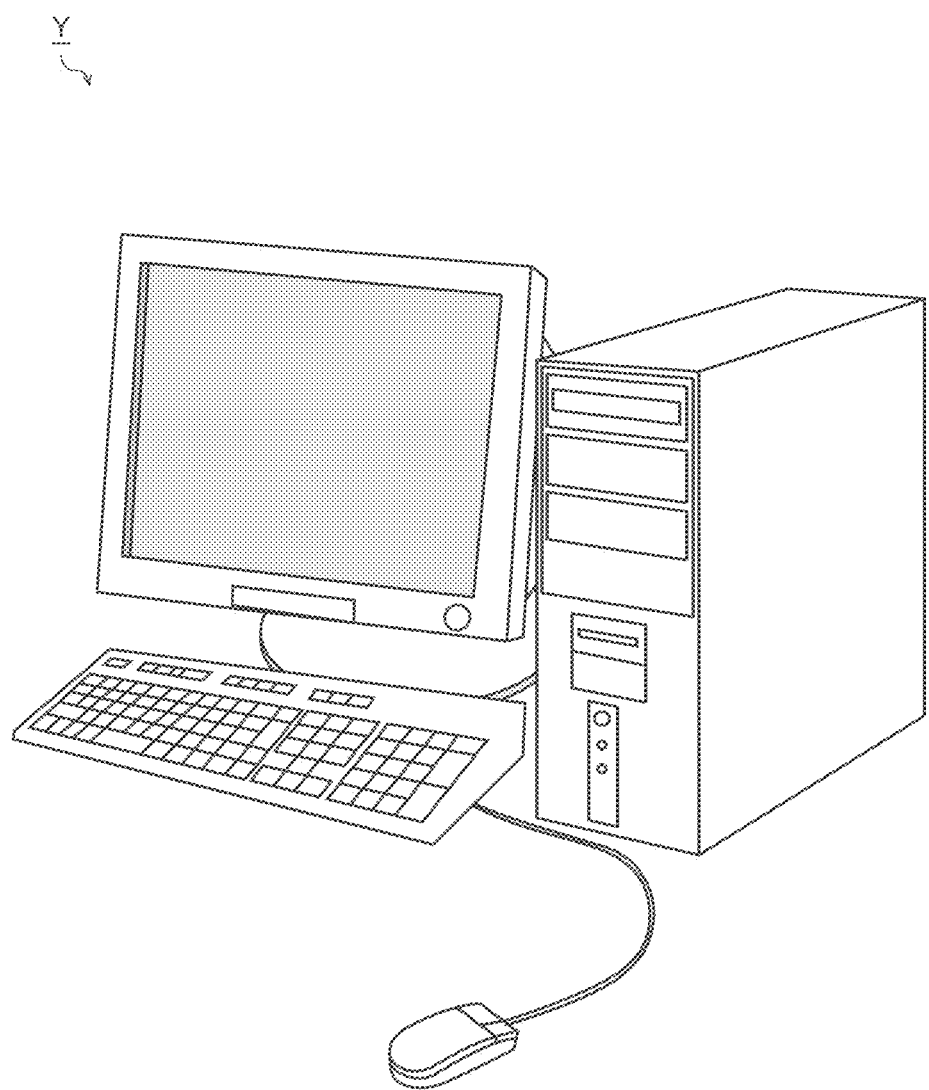
FIG. 27 is an exterior view of a personal computer.
Figure 28:
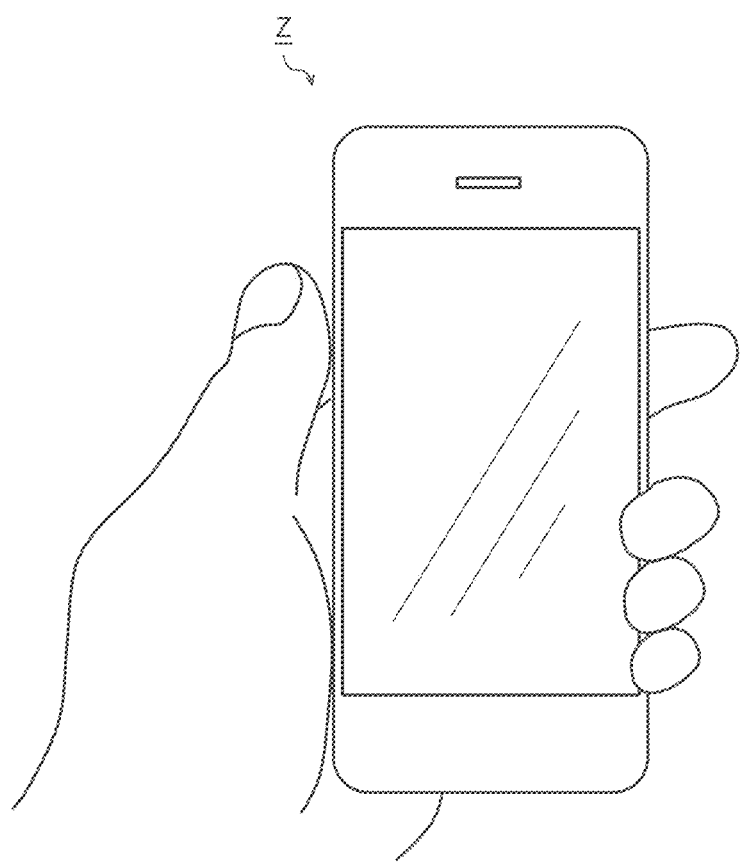
FIG. 28 is an exterior view of a smartphone.

The switching power supplies 100 described above can be used as a power supplying means in a variety of applications, examples including a television receiver X as shown in FIG. 26, a personal computer Y as shown in FIG. 27, and a smartphone as shown in FIG. 28. Needless to say, the switching power supplies 100 can be applied in any applications other than those specifically mentioned just above.

Overview

To follow is an overview of the various embodiments disclosed herein.

A switching power supply disclosed herein includes a switching output circuit which, by turning on and off high-side and low-side switches, drives an inductor current to generate an output voltage from an input voltage, a low-side current sensor which senses the inductor current passing through the low-side switch during the on-period of the low-side switch to acquire low-side current feedback information, an error amplifier which outputs voltage feedback information including error information obtained by comparing the output voltage or a feedback voltage commensurate with the output voltage with a reference voltage as its target, an information synthesizer which combines the voltage feedback information with the low-side current feedback information to generate synthesized feedback information, and an information holder which samples the synthesized feedback information during the on-period of the low-side switch (a first configuration).

The switching power supply according to the first configuration, preferably, further includes a ramp signal generation circuit which generates a ramp signal that rises or falls at least during the on-period of the high-side switch, and a PWM comparator which, during the on-period of the high-side switch, compares the ramp signal with a hold signal that is output from the information holder, to determine turn-off time point of the high-side switch (a second configuration).

In the switching power supply according to the second configuration, preferably, the information holder includes a pair of sample and hold circuits which receive differential input of the synthesized feedback information. The ramp signal generation circuit includes a current source which feeds a constant current into a capacitor in one or both of the sample and hold circuits. The PWM comparator compares the hold signal with a signal having the ramp signal added to or subtracted from it (a third configuration).

In the switching power supply according to the third configuration, preferably, while the gradient of the ramp signal varies in a way depending on the input voltage, the gradient of the ramp signal does not depend on the output voltage (a fourth configuration).

In the switching power supply according to the fourth configuration, preferably, the error amplifier has a current capacity higher than a current capacity of the current source (a fifth configuration).

In the switching power supply according to any one of the first to fifth configurations, preferably, the switching power supply generates the on-timing of the high-side switch using a clock signal, and has the off-timing of the high-side switch before the on-timing (a sixth configuration).

In the switching power supply according to the sixth configuration, preferably, the switching power supply has a function of ignoring the off-timing of the high-side switch to extend the on-period of the high-side switch when the output voltage is lower than the reference voltage (a seventh configuration).

The switching power supply according to the seventh configuration, preferably, further includes a high-side current sensor which senses the inductor current that passes through the high-side switch during the on-period of the high-side switch, to acquire high-side current feedback information. The information synthesizer combines the voltage feedback information with the high-side current feedback information to generate the synthesized feedback information, and when the off-timing of the high-side switch is ignored so that the on-period of the high-side switch is extended, the information holder samples the synthesized feedback information (an eighth configuration).

In the switching power supply according to the eighth configuration, preferably, the high-side current sensor includes a current source that feeds a variable current commensurate with the high-side current feedback information into a resistor in the information synthesizer (an ninth configuration).

The switching power supply according to any one of the first to ninth configurations, preferably, further includes an error corrector that detects an input error in the error amplifier, which includes no integrating element, to correct an input signal to or an output signal from the error amplifier (a tenth configuration).

In the switching power supply according to the tenth configuration, preferably, the error corrector includes a comparator which detects an input error in the error amplifier and a digital calibrator which corrects the input signal to or the output signal from the error amplifier in accordance with the result of detection by the comparator (an eleventh configuration).

In the switching power supply according to the tenth configuration, preferably, the error corrector includes an error correction amplifier which is connected in parallel with the error amplifier and which operates slower than the error amplifier (a twelfth configuration).

A semiconductor integrated circuit device, which serves as a main controlling agent in a switching power supply that generates an output voltage from an input voltage, is built by integrating together a feedback terminal for receiving feedback input of the output voltage, a feedback voltage generation circuit which generates a feedback voltage commensurate with a terminal voltage at the feedback terminal, an output feedback controller which controls the duty of the switching power supply such that the feedback voltage remains equal to a predetermined reference voltage, and an open protector which varies the terminal voltage at the feedback terminal such that the on-duty of the switching power supply is lowered when the feedback terminal becomes open (a thirteenth configuration).

In the semiconductor integrated circuit device according to the thirteenth configuration, preferably, the open protector, when the feedback terminal becomes open, raises the terminal voltage at the feedback terminal such that the feedback voltage becomes higher than the reference voltage, and the output feedback controller, when the feedback voltage is higher than the reference voltage, sets the on-duty of the switching power supply at a zero value or a value comparable to it (a fourteenth configuration).

In the semiconductor integrated circuit device according to the fourteenth configuration, preferably, the open protector is a current source or a resistor which passes a pull-up current through the feedback terminal (a fifteenth configuration).

In the semiconductor integrated circuit device according to the fifteenth configuration, preferably, the feedback voltage generation circuit includes a first resistor connected between the feedback terminal and an output terminal for the feedback voltage, and a second resistor connected between the output terminal for the feedback voltage and a reference potential terminal (a sixteenth configuration).

In the semiconductor integrated circuit device according to the sixteenth configuration, preferably, a current value of the pull-up current that passes from the open protector into the feedback voltage generation circuit when the feedback terminal is open multiplied by a resistance value of the second resistor is higher than the reference voltage (a seventeenth configuration).

In the semiconductor integrated circuit device according to the sixteenth or seventeenth configuration, preferably, the current value of the pull-up current that passes from the open protector into the feedback voltage generation circuit when the feedback terminal is not open multiplied by the resistance value of the second resistor is negligibly low compared with the reference voltage (an eighteenth configuration).

In the semiconductor integrated circuit device according to any one of the sixteenth to eighteenth configurations, preferably, the feedback voltage generation circuit further includes a capacitor that is connected in parallel with the second resistor (a nineteenth configuration).

In the semiconductor integrated circuit device according to the nineteenth configuration, preferably, the open protector generates the pull-up current intermittently (a twentieth configuration).

A semiconductor integrated circuit device, which serves as a main controlling agent in a switching power supply that generates an output voltage from an input voltage, is built by integrating together a feedback terminal for receiving feedback input of the output voltage, an output feedback controller which controls the duty of the switching power supply such that a terminal voltage at the feedback terminal remains equal to a predetermined reference voltage, and an open protector which varies the terminal voltage at the feedback terminal such that the on-duty of the switching power supply is lowered when the feedback terminal becomes open (a twenty first configuration).

A switching power supply includes the semiconductor integrated circuit device according to any one of the thirteenth to twenty first configurations as a main controlling agent (a twenty second configuration).

A differential input circuit includes a first differential input stage which receives a differential input signal with a pair of P-channel transistors, a second differential input stage which receives the differential input signal with a pair of N-channel transistors, and an input stage switcher which selectively makes one of the first and second differential input stages operate (a twenty third configuration).

In the differential input circuit according to the twenty third configuration, preferably, when the differential input signal is lower than a predetermined threshold level that is set in an active region common to the first and second differential input stages, the input stage switcher makes the first differential input stage operate and keeps the second differential input stage inoperative and, when the differential input signal is higher than the threshold level, the input stage switcher makes the second differential input stage operate and keeps the first differential input stage inoperative (a twenty fourth configuration).

In the differential input circuit according to the twenty fourth configuration, preferably, the input stage switcher supplies a driving current to one of the first and second input stages in accordance with an input stage switch signal (a twenty fifth configuration).

In the differential input circuit according to the twenty fifth configuration, preferably, the input stage switcher includes a differential pair which receives the input stage switch signal and its logically inverted signal, and a current source which feeds the differential pair with a current. Two-channel currents output from the differential pair are output as respective driving currents for the first and second differential input stages (a twenty sixth configuration).

A differential input circuit includes: a differential input stage including a first differential input terminal for receiving a first differential input signal from a first signal source, and a second differential input terminal for receiving a second differential input signal from a second signal source which has a lower impedance than the first signal source; and a signal path switcher which, during start-up of the differential input stage, keeps the first differential input terminal disconnected from the first signal source and short-circuited to the second differential input terminal and, after start-up of the differential input stage, keeps the first differential input terminal disconnected from the second differential input terminal and connected to the first signal source (a twenty seventh configuration).

In the differential input circuit according to the twenty seventh configuration, preferably, the signal path switcher, after start-up of the differential input stage until a predetermined short-circuit time passes, keeps the first differential input terminal disconnected from the first signal source and short-circuited to the second differential input terminal and, after the short-circuit time has passed, keeps the first differential input terminal disconnected from the second differential input terminal and connected to the first signal source (a twenty eighth configuration).

In the differential input circuit according to the twenty eighth configuration, preferably, the short-circuit time is longer than a kickback time during start-up of the differential input stage (a twenty ninth configuration).

In the differential input circuit according to any one of the twenty seventh to twenty ninth configurations, preferably, the signal path switcher, when the differential input stage is inoperative, keeps the first differential input terminal disconnected from the first signal source and short-circuited to the second differential input terminal (a thirtieth configuration).

An error amplifier includes, as its input stage, the differential input circuit according to any one of the twenty third to thirtieth configurations (a thirty first configuration).

A switching power supply includes a switching output circuit which generates an output voltage from an input voltage, the error amplifier according to the thirty first configuration which generates an error signal commensurate with a difference between the output voltage or a feedback voltage commensurate with the output voltage and a predetermined reference voltage, and a PWM comparator which controls the duty by comparing the error signal with a ramp signal (a thirty second configuration).

Other Modified Examples

The various technical features disclosed herein may be implemented in any other manner than in the embodiments described above, and allow for many modifications without departing from the spirit of the present invention. That is, the above embodiments should be understood to be in every aspect illustrative and not restrictive. The scope of the present invention is defined not by the description of the embodiments given above but by the appended claims, and should be understood to encompass any modifications made in the sense and scope equivalent to those of the claims.

Industrial Applicability

The switching power supplies disclosed herein can be used as a power supplying means in a variety of applications (for example, television receivers, personal computers, and smartphones).

REFERENCE SIGNS LIST 100 switching power supply
110 switching output circuit
111 output transistor (PMOSFET)
112 synchronous rectification transistor (NMOSFET)
113 inductor
114 capacitor
120 feedback voltage generation circuit
121, 122 resistor
123 capacitor
130 reference voltage generation circuit
140 error amplifier
150 ramp signal generation circuit
151 current source
160 oscillator
170 PWM comparator
180 control circuit
190 switch driving circuit
191, 192 driver
200 semiconductor integrated circuit device (power control IC)
210 low-side current sensor
211 switch
212 resistor
220 information synthesizer
221, 222 resistor
230 information holder
231, 232 sample and hold circuit
240 error corrector
241 comparator
242 digital calibrator
243 error correction amplifier
244 capacitor
245 resistor
246 digital calibrator
247 error correction amplifier
250 high-side current sensor
251 current source
300 differential input circuit
310 differential input stage (P-channel)
311, 312, 314 PMOSFET
313 current source
320 differential input stage (N-channel)
321, 322, 324 NMOSFET
323 current source
330 gm flattener
340 input stage switcher
341, 342, 343 PMOSFET
344, 345, 346 NMOSFET
347 current source
348 inverter
350 differential input stage
351, 352 NMOSFET
353 current source
360, 370 signal path switcher
371, 372, 373 switch
374 inverter
400 amplifying circuit
500 differential output circuit
600 open protector
C1, C2 capacitor
SW1, SW2 switch
T1, T2, T3, T4 terminal
X television receiver
Y personal computer
Z smartphone

The invention claimed is:

1. A switching power supply, comprising:
a switching output circuit configured to, by turning on and off high-side and low-side switches, drive an inductor current to generate an output voltage from an input voltage;
a low-side current sensor configured to sense the inductor current passing through the low-side switch during an on-period of the low-side switch to acquire low-side current feedback information;
an error amplifier configured to output voltage feedback information including error information obtained by comparing the output voltage or a feedback voltage commensurate with the output voltage with a reference voltage as a target thereof;
an information synthesizer configured to combine the voltage feedback information with the low-side current feedback information to generate synthesized feedback information; and
an information holder configured to sample the synthesized feedback information during the on-period of the low-side switch.

2. The switching power supply according to claim 1 further comprising:
a ramp signal generation circuit configured to generate a ramp signal that rises or falls at least during the on-period of the high-side switch; and
a PWM comparator configured to, during the on-period of the high-side switch, compare the ramp signal with a hold signal that is output from the information holder, to determine a turn-off time point of the high-side switch.

3. The switching power supply according to claim 2, wherein
the information holder includes a pair of sample and hold circuits configured to receive differential input of the synthesized feedback information, the ramp signal generation circuit includes a current source configured to feed a constant current into a capacitor in one or both of the sample and hold circuits, and the PWM comparator compares the hold signal with a signal having the ramp signal added thereto or subtracted therefrom.

4. The switching power supply according to claim 3, wherein, while a gradient of the ramp signal varies in a way depending on the input voltage, the gradient of the ramp signal does not depend on the output voltage.

5. The switching power supply according to claim 3, wherein the error amplifier has a current capacity higher than a current capacity of the current source.

6. The switching power supply according to claim 1, wherein the switching power supply is configured to generate an on-timing of the high-side switch using a clock signal, and have an off-timing of the high-side switch before the on-timing.

7. The switching power supply according to claim 6, wherein the switching power supply is configured to have a function of ignoring the off-timing of the high-side switch to extend the on-period of the high-side switch when the output voltage is lower than the reference voltage.

8. The switching power supply according to claim 7, further comprising a high-side current sensor configured to sense the inductor current that passes through the high-side switch during the on-period of the high-side switch, to acquire high-side current feedback information, wherein the information synthesizer combines the voltage feedback information with the high-side current feedback information to generate the synthesized feedback information, and when the off-timing of the high-side switch is ignored so that the on-period of the high-side switch is extended, the information holder samples the synthesized feedback information.

9. The switching power supply according to claim 8, wherein the high-side current sensor includes a current source that feeds a variable current commensurate with the high-side current feedback information into a resistor in the information synthesizer.

10. The switching power supply according to claim 1, further comprising an error corrector configured to detect an input error in the error amplifier, which includes no integrating element, to correct an input signal to or an output signal from the error amplifier.

11. The switching power supply according to claim 10, wherein the error corrector includes:
a comparator configured to detect an input error in the error amplifier; and
a digital calibrator configured to correct the input signal to or the output signal from the error amplifier in accordance with a result of detection by the comparator.

12. The switching power supply according to claim 10, wherein the error corrector includes an error correction amplifier which is connected in parallel with the error amplifier and which is configured to operate slower than the error amplifier.

* * * * *